(12) United States Patent
Won

(10) Patent No.: US 9,230,931 B2
(45) Date of Patent: Jan. 5, 2016

(54) SEMICONDUCTOR DEVICE AND METHOD FOR FORMING THE SAME

(71) Applicant: SK HYNIX INC., Icheon (KR)

(72) Inventor: Sang Min Won, Seoul (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/269,006

(22) Filed: May 2, 2014

(65) Prior Publication Data

US 2015/0145013 A1 May 28, 2015

(30) Foreign Application Priority Data

Nov. 25, 2013 (KR) ........................ 10-2013-0144091

(51) Int. Cl.
*H01L 29/76* (2006.01)
*H01L 23/00* (2006.01)
*H01L 29/417* (2006.01)
*H01L 21/768* (2006.01)
*H01L 27/108* (2006.01)

(52) U.S. Cl.
CPC ............. *H01L 24/06* (2013.01); *H01L 21/768* (2013.01); *H01L 21/76877* (2013.01); *H01L 27/10823* (2013.01); *H01L 27/10885* (2013.01); *H01L 29/41725* (2013.01); *H01L 2924/047* (2013.01)

(58) Field of Classification Search
CPC . H01L 24/06; H01L 21/768; H01L 27/10823; H01L 29/41725; H01L 27/10885; H01L 21/76877; H01L 2924/047
See application file for complete search history.

(56) References Cited

U.S. PATENT DOCUMENTS

| | | | |
|---|---|---|---|
| 2005/0077560 A1* | 4/2005 | Shiratake | H01L 27/10888 257/296 |
| 2010/0096693 A1 | 4/2010 | Hong | |
| 2010/0171160 A1* | 7/2010 | Katsuki | H01L 27/0207 257/306 |
| 2014/0027916 A1* | 1/2014 | Lee | H01L 21/764 257/773 |

FOREIGN PATENT DOCUMENTS

| | | |
|---|---|---|
| KR | 10-2010-0042904 A | 4/2010 |
| KR | 10-2011-0078022 A | 7/2011 |

* cited by examiner

*Primary Examiner* — Victor A Mandala

(57) ABSTRACT

A semiconductor device includes an active region tilted at an angle with respect to a buried bit line. The buried bit line includes a metal silicide pattern and a metal pattern. The metal silicide pattern has a plurality of metal silicide films each disposed at a lower portion of the active region and corresponding to a bit line contact region. The metal pattern has a plurality of metal films. The metal silicide films and the metal films are alternately arranged and electrically coupled to each other.

6 Claims, 27 Drawing Sheets

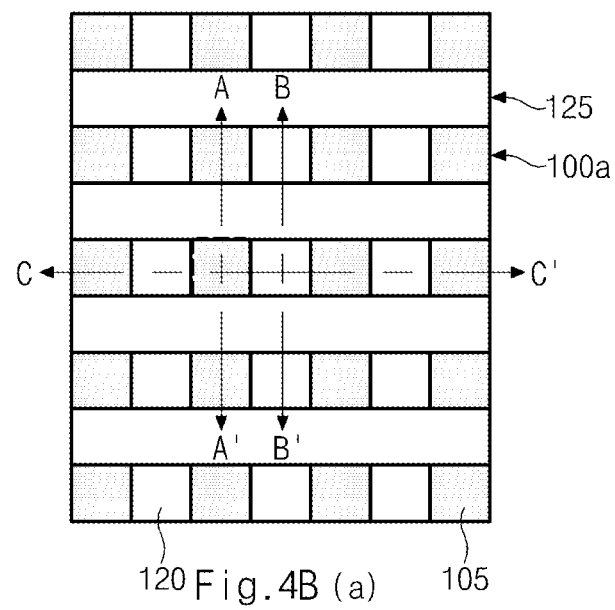
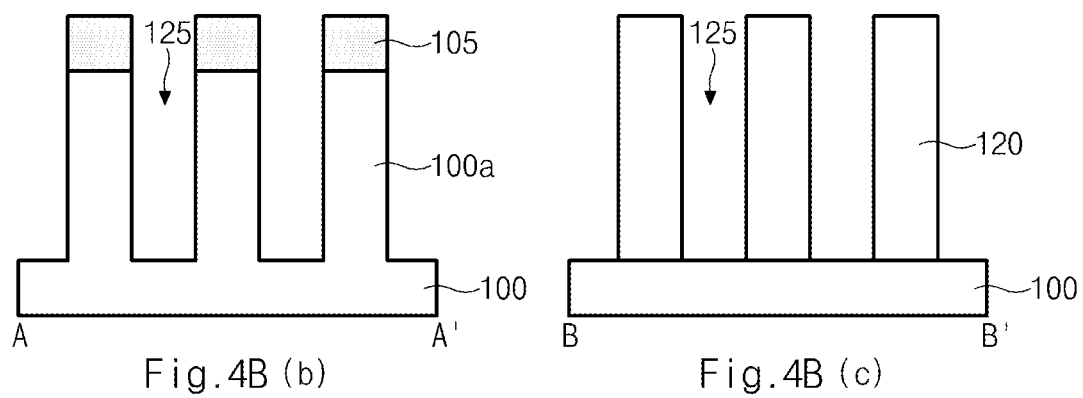
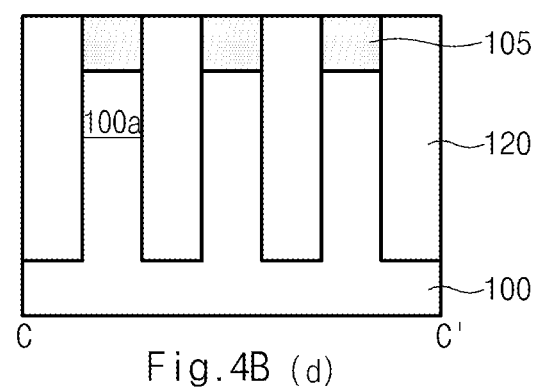
Fig.4B (a)
Fig.4B (b)     Fig.4B (c)
Fig.4B (d)

SEMICONDUCTOR DEVICE AND METHOD FOR FORMING THE SAME

CROSS-REFERENCE TO RELATED APPLICATION

The priority of Korean patent application No. 10-2013-0144091 filed on 25 Nov. 2013, which is hereby incorporated by reference in its entirety, is claimed.

BACKGROUND

Embodiments relate to a semiconductor device and a method for forming the same, and more particularly to a semiconductor device including a buried bit line.

As highly integrated semiconductor devices have developed, cell structure (or cell layout) is changing from $8F^2$ and $6F^2$ structures to a $4F^2$ structure. In order to reduce the size of a unit cell, various methods for forming constituent elements (such as transistors, word lines, capacitors, and the like) have been developed by research institutions and companies. For example, a semiconductor device in which a source and a drain are vertically arranged to implement the $4F^2$ cell structure, and thereby inducing a vertical channel, has been proposed.

A semiconductor device having a vertical channel includes a gate electrode adjacent to an active pillar, which extends vertically from a main surface of a substrate. A semiconductor device having a vertical channel also includes sources and drains at portions of the active pillar that are over and under the gate electrode, respectively. As a result, a channel is vertically formed in a portion of the active pillar beneath the gate electrode. Since a channel is formed vertically, the length of the channel of the resultant semiconductor device may not be as significantly affected by a reduction in the size of a unit cell region of the semiconductor device.

A semiconductor device having a vertical channel may further include a buried bit line (BBL) structure in which a bit line is buried in a region of the substrate below the active pillar.

In the $4F^2$ structure, a buried bit line has a line shape and is formed of metal silicide. However, portions of the silicide line may aggregate so that the line has thinner portions, thereby increasing electrical resistance of the buried bit line.

In addition, during a plasma doping process to form a junction of the buried bit line, a bending or a leaning of an active region may occur due to plasma residue.

In a $6F^2$ structure, a process for etching the active region is carried out to define a buried bit line. Due to the etched active region, a contact region between a word line and an active region and/or a storage node contact (SNC) region may be reduced in size. As a result, control capability of word lines and an Iop are unavoidably reduced.

SUMMARY

Various embodiments are directed to providing a semiconductor device and a method for forming the same, which may address one or more problems of the related art.

An embodiment relates to a semiconductor device and a method for forming the semiconductor device. For example, a semiconductor device in accordance with an embodiment includes a buried bit line in which a metal silicide pattern, having a plurality of metal silicide films, and a metal pattern, having a plurality of metal films, are alternately arranged. As a result, the level of difficulty of fabrication processes and the number of fabrication processes are reduced, and resistance characteristics and reliability of the semiconductor device are improved.

In accordance with an aspect of the embodiment, a semiconductor device includes: a line-type active region formed to be obliquely tilted; and a buried bit line in which at least one metal silicide pattern formed at a bottom of the active region of a bit line contact region and a metal pattern formed to interconnect the metal silicide patterns contiguous to each other are alternately arranged.

In accordance with another aspect of the embodiment, a method for forming a semiconductor device includes: forming a bar-shaped active region and a device isolation region; forming a recess by etching the device isolation region of a bit line reserved region; forming a first metal pattern in the recess; forming a metal silicide pattern in the active region by diffusing metal ions of the first metal pattern; removing the first metal pattern; and burying a second metal pattern in the recess, thereby forming a buried bit line connected to the metal silicide pattern and the second metal pattern.

In accordance with another aspect of the embodiment, a semiconductor device includes: a pillar-type active region arranged in a matrix shape; and a buried bit line in which a metal silicide pattern formed below the active region and a metal pattern formed to interconnect the metal silicide patterns contiguous to each other are alternately arranged.

Forming the active region and the device isolation region includes: forming a line pattern including a line shape that is disposed at an angle with respect to the buried bit line; forming a mask pattern over the line pattern, the mask pattern including a plurality of holes, the plurality of holes being arranged over opposing ends of the line shape; and etching the line pattern to form a trench.

After forming the trench, forming a first sacrificial film over a bottom surface of the trench and forming a second sacrificial film over the first sacrificial film, the first and second sacrificial films having different etching rates; forming a spacer over a sidewall of the trench; removing the second sacrificial film to expose a portion of a sidewall of the active region; and etching the exposed portion of the sidewall of the active region to form a concave bulb.

The second metal pattern is disposed at substantially the same level as the metal silicide pattern.

A bottom surface of the metal silicide pattern is disposed at substantially the same level as a bottom portion of the concave bulb.

The first metal pattern includes cobalt, and the metal silicide pattern includes cobalt silicide.

The second metal pattern includes tungsten (W).

In accordance with another aspect of the embodiment, a method for forming a semiconductor device includes: forming a pillar-shaped active region and a device isolation region; forming a recess by etching the device isolation region of a bit line reserved region; forming a first metal pattern in the recess; forming a metal silicide pattern in the active region by diffusing metal ions of the first metal pattern; removing the first metal pattern; and burying a second metal pattern in the recess, thereby forming a buried bit line connected to the metal silicide pattern and the second metal pattern.

Forming the active region and the device isolation region includes: forming a line pattern including a plurality of lines each extending in a first direction; forming a first insulation film between two adjacent lines of the line pattern; forming a mask pattern including a plurality of mask lines extending in a second direction, the second direction being substantially perpendicular to the first direction; etching the line pattern and the first insulation film using the mask pattern as an etch mask to form a trench; and forming a second insulation film in the trench.

After forming the trench, forming a sacrificial film pattern over a bottom surface of the trench; forming a spacer over a sidewall of the trench; removing the sacrificial film pattern to expose a portion of a sidewall of the active region; etching the exposed portion of the sidewall of the active region to form a concave bulb.

The second metal pattern is disposed at substantially the same level as the metal silicide pattern.

A bottom surface of the metal silicide pattern is disposed over an upper portion of the concave bulb.

The first metal pattern includes cobalt, and the metal silicide pattern includes cobalt silicide.

The second metal pattern includes tungsten (W).

It is to be understood that both the foregoing general description and the following detailed description of embodiments are intended to provide further explanation of the invention as claimed.

BRIEF DESCRIPTION OF THE DRAWINGS

FIGS. 2A(b) to 2A(d), 2B(b) to 2B(d), 2C(b) to 2C(d), 2D(b) to 2D(d), 2E(b) to 2E(d), 2F(b) to 2F(d), 2G(b) to 2G(d), and 2H(b) to 2H(d) are cross-sectional views illustrating a method of forming a semiconductor device according to an embodiment.

FIGS. 4A(b) to 4A(d), 4B(b) to 4B(d), 4C(b) to 4C(d), 4D(b) to 4D(d), 4E(b) to 4E(d), 4F(b) to 4F(d), 4G(b) to 4G(d), and 4H(b) to 4H(d) are cross-sectional views illustrating a method of forming a semiconductor device according to an embodiment.

FIGS. 6A(b), 6A(c), 6B(b), 6B(c), 6C(b), 6C(c), 6D(b), 6D(c), 6E(b), 6E(c), 6F(b), 6F(c), 6G(b), 6G(c), 6H(b) and 6H(c) are cross-sectional views illustrating a method of forming a semiconductor device according to an embodiment.

DESCRIPTION OF EMBODIMENTS

Reference will now be made in detail to certain embodiments of the present disclosure, examples of which are illustrated in the accompanying drawings. Wherever possible, the same reference numbers are used throughout the drawings to refer to the same or like portions. A semiconductor device and a method for forming the same according to embodiments will hereinafter be described with reference to the accompanying drawings.

Figure 1:
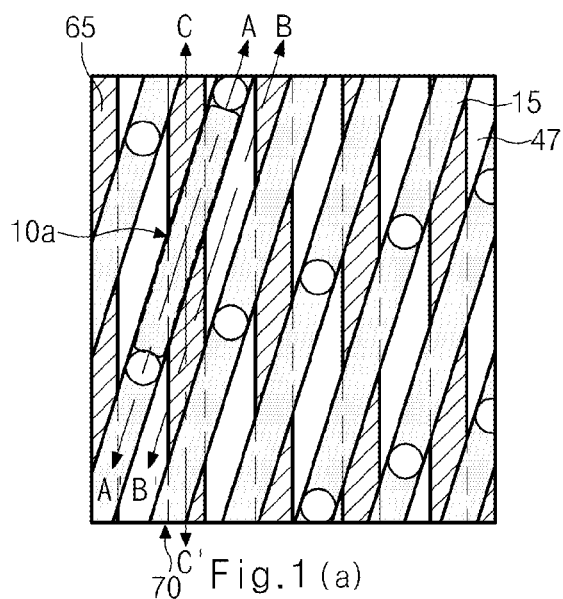
FIG. 1(a) is a plan view and FIGS. 1(b) to 1(d) are cross-sectional views illustrating a semiconductor device according to an embodiment.
Figure 1:
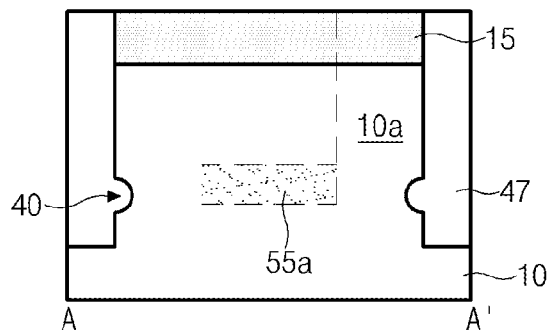
Figure 1:
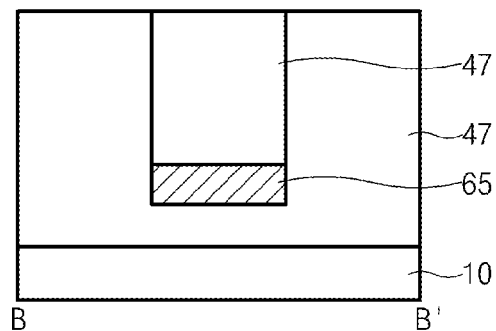
Figure 1:
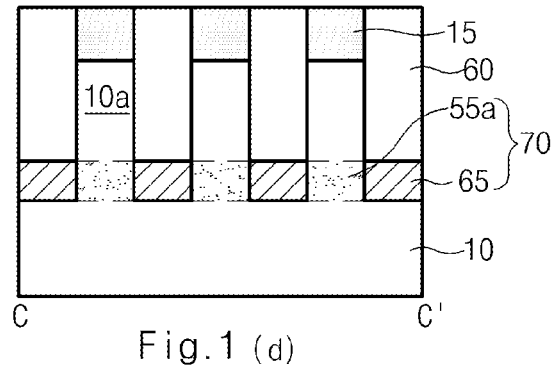

FIG. 1(a) is a plan view illustrating a semiconductor device according to an embodiment. FIG. 1(b), FIG. 1(c), and FIG. 1(d) are cross-sectional views illustrating the semiconductor device taken along the line A-A', the line B-B', and the line C-C' of FIG. 1(a), respectively.

Referring to FIG. 1(a), a semiconductor device according to an embodiment includes a semiconductor substrate 10 having an active region 10a and a device isolation film 47. The semiconductor substrate 10 may include a crystalline silicon material, for example, a silicon substrate, a silicon germanium (SiGe) substrate, or a Silicon On Insulator (SOI) substrate. The active region 10a may be one of a plurality of lines in a line pattern, and may be tilted at a predetermined angle with respect to the vertical axis of FIG. 1(a).

Referring to FIG. 1(b), the active region 10a includes a concave bulb 40 at a first lower portion of the sidewall of the active region 10a. In an embodiment, the concave bulb 40 is formed at one end of the active region 10a. In the embodiment shown in FIG. 1(b), the concave bulb 40 is formed at two opposing ends of the active region 10a. In an embodiment, the concave bulb 40 comprises curved surfaces that extend into the active region 10a, thus creating a region at the bottom of the active region 10a that is narrower than upper portions of the active region 10a. For example, the concave bulb 40 may be a bulb extending into the active region 10a. Although embodiments are not limited to concave bulb 40 having curved surfaces or a bulb shape, for convenience of description, the concave bulb 40 will hereinafter be referred to as a concave bulb 40. A metal silicide pattern comprises a plurality of metal silicide films 55a and each metal silicide film 55a is located at the bottom of a bit line contact region corresponding to a center portion of the active region 10a. The metal silicide film 55a is located at a second lower portion within the active region 10a, as shown in FIG. 1(b). In an embodiment, the second lower portion is disposed at substantially the same level as the first lower portion of the concave bulb 40. In an embodiment, the top surface of the metal silicide film 55a may be disposed at substantially the same level as that of an uppermost surface of the concave bulb 40. In an embodiment, the bottom surface of the metal silicide film 55a may be disposed at substantially the same level as a bottom surface of the concave bulb 40. In an embodiment, a middle portion of the metal silicide film 55a may be disposed at substantially the same level as a middle portion of the concave bulb 40, i.e., the innermost portion of the concave bulb 40. In an embodiment, the metal silicide pattern 55a includes a cobalt silicide (CoSi) material.

A metal pattern 65 comprises a plurality of metal films and each metal film is formed at the bottom of a device isolation film 47. In an embodiment, the metal pattern 65 may include tungsten (W), which serves as a low-resistance material. However, embodiments are not limited thereto, and another low-resistance material may be used. The metal film 65 is formed in a bit line region adjoining the bit line contact region. Referring to FIG. 1(d), the metal film 65 is located at substantially the same level as that of the metal silicide film 55a. As a result, the metal film 65 is electrically coupled to two adjoining metal silicide films 55a. That is, the metal silicide films 55a and the metal pattern 65 are alternately arranged and are electrically coupled to form a buried bit line 70.

Figure 2A:
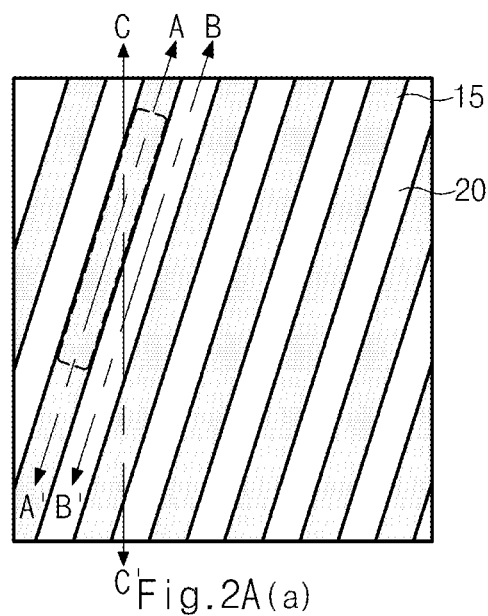
FIGS. 2A(a), 2B(a), 2C(a), 2D(a), 2E(a), 2F(a), 2G(a), and 2H(a) are plan views illustrating a method of forming a semiconductor device according to an embodiment.
Figure 2A:
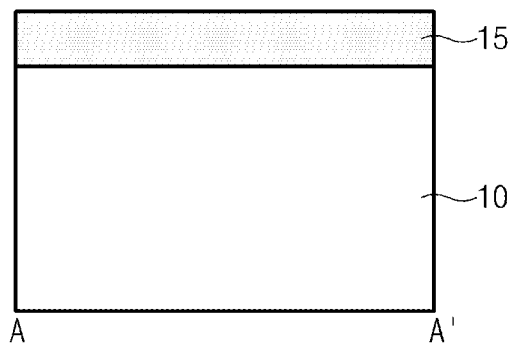
Figure 2A:
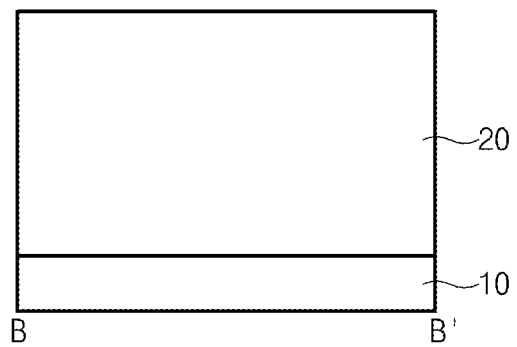
Figure 2A:
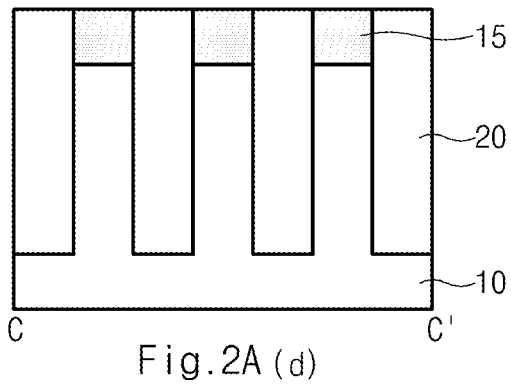

FIGS. 2A(a) to 2H(d) are plan views and cross-sectional views illustrating a method of forming a semiconductor device according to the embodiment shown in FIGS. 1A(a) to (d). In more detail, in each group of FIGS. 2A to 2H, (a) is a plan view illustrating the semiconductor device, (b) is a cross-sectional view illustrating the semiconductor device taken along the line A-A' of Fig. (a), (c) is a cross-sectional view illustrating the semiconductor device taken along the line B-B' of Fig. (a), and (c) is a cross-sectional view illustrating the semiconductor device taken along the line C-C' of Fig. (a).

Referring to FIGS. 2A(a) to (d), a first mask pattern 15 exposing a device isolation film is formed over the semiconductor substrate 10. In an embodiment, the first mask pattern 15 may include a nitride film. Due to limited resolution of a photolithography device, a space between the active regions in a conventional $6F^2$ structure may become excessively narrow. Thus, in an embodiment, the first mask pattern 15 comprises a plurality of mask pattern lines that are tilted at a predetermined angle with respect to the vertical axis of the plan view of FIG. 2A(a).

Thereafter, the semiconductor substrate 10 is etched using the first mask pattern 15 as an etch mask so that a first trench (not shown) is formed. A first insulation film 20 is formed to fill in the first trench (not shown). In an embodiment, the first insulation film 20 may be formed of a nitride film, an oxide film, or a combination thereof.

Figure 2B:
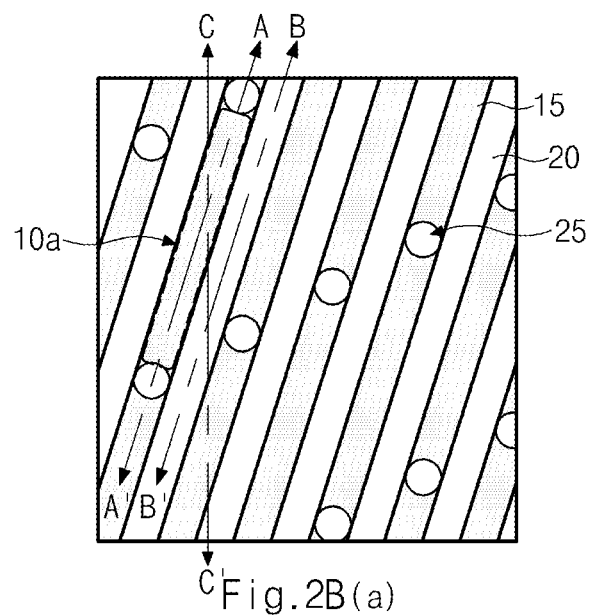
Figure 2B:
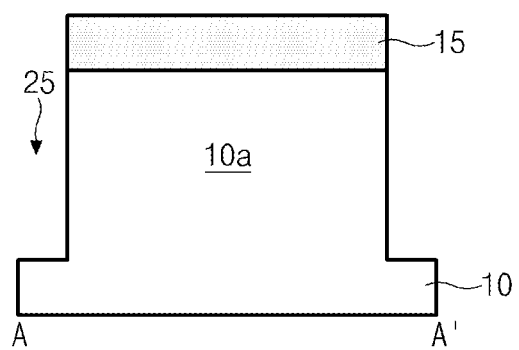
Figure 2B:
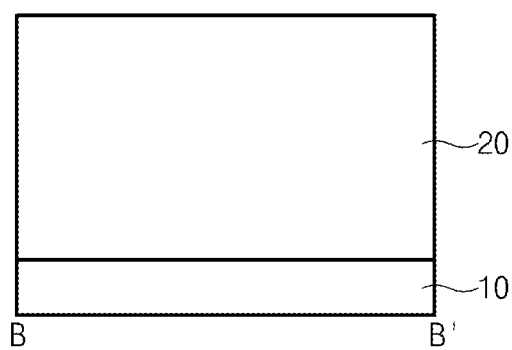
Figure 2B:
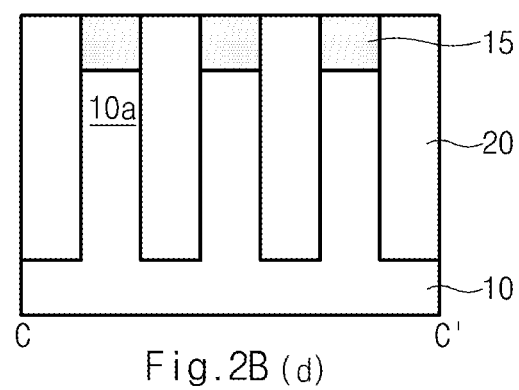

Referring to FIGS. 2B(a) to (d), a second mask pattern (not shown) is formed. The second mask pattern is used to form a hole pattern comprising a plurality of trenches or holes in the first mask pattern 15. The second mask pattern (not shown) serves as a cutting mask, which defines a length of the active region by cutting a mask pattern line to expose a specific region in which a device isolation region will be formed.

Thereafter, the first mask pattern 15 and the semiconductor substrate 10 are etched using the second mask pattern (not shown) as an etch mask, so that second trenches 25 are formed. As shown in FIGS. 2B(a) and 2B(b), an active region 10a defined by two second trenches 25 is formed.

Figure 2C:
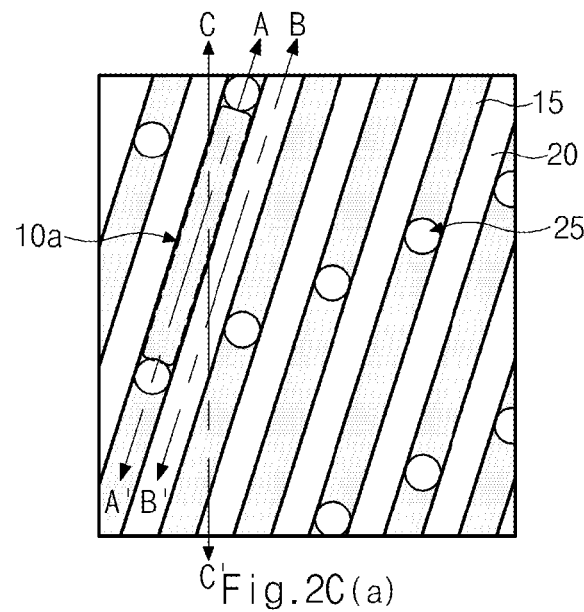
Figure 2C:
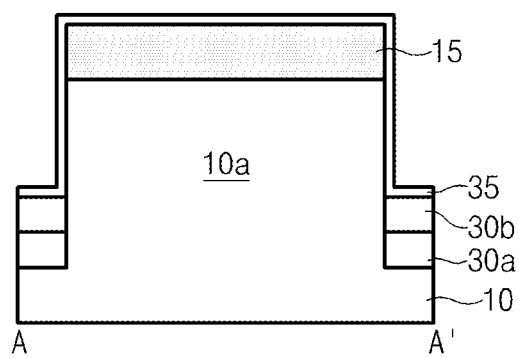
Figure 2C:
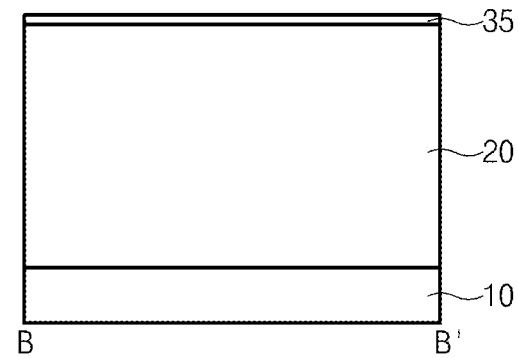
Figure 2C:
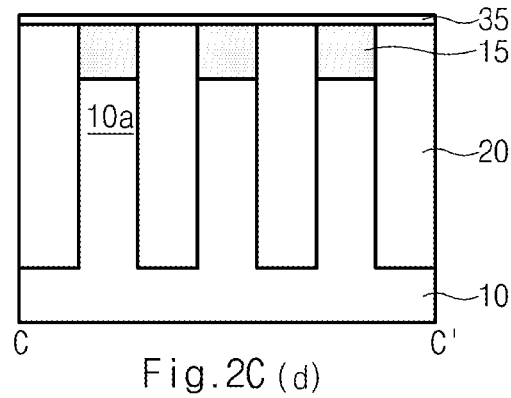

Referring to FIGS. 2C(a) to (d), a first sacrificial film 30a and a second sacrificial film 30b are sequentially formed over the bottom surface of the second trench 25. In an embodiment, the first sacrificial film 30a and the second sacrificial film 30b may have different etching rates under the same etching conditions. In an embodiment, the first sacrificial film 30a and the second sacrificial film 30b, respectively, may include a nitride film, an oxide film, and a silicon film.

A spacer layer 35 is formed over the entire surface of the semiconductor substrate 10. In an embodiment, the spacer film 35 may include a nitride film.

Figure 2D:
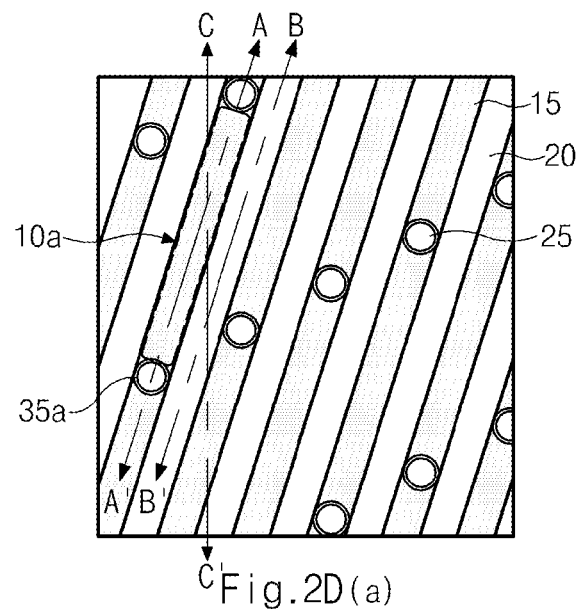
Figure 2D:
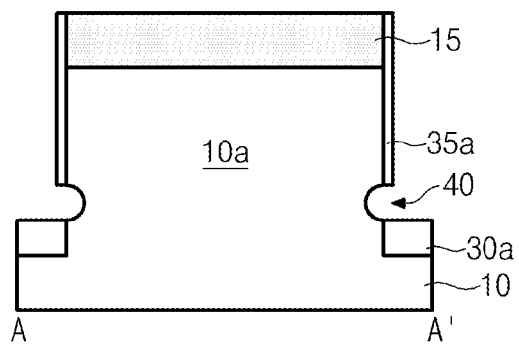
Figure 2D:
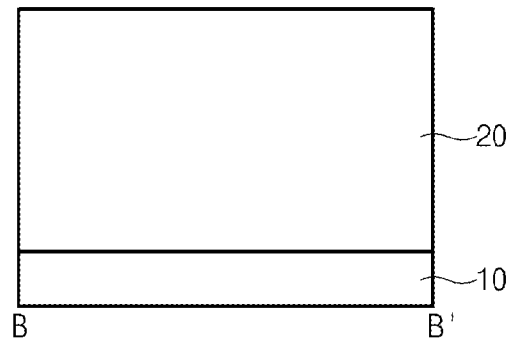
Figure 2D:
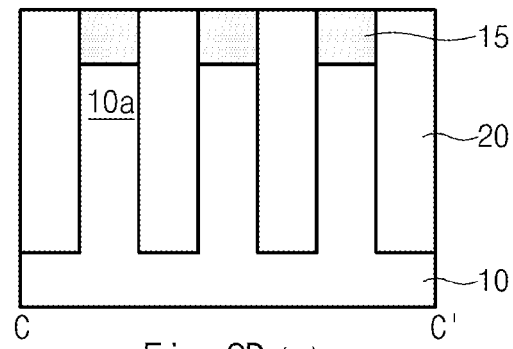

Referring to FIGS. 2D(a) to (d), an etchback process is carried out so that a spacer 35a is formed at an inner sidewall of the second trench 25. The second sacrificial film 30b may be removed during or after formation of the spacer 35a. When the second sacrificial film 30b is removed, a portion of the semiconductor substrate in the active region 10a is exposed. The exposed portion corresponds to a lower portion of the inner sidewall of the second trench 25. The exposed semiconductor substrate 10 is further etched, so that two concave bulbs 40 are formed at the lower portions of opposing sides of the active region 10a along a longitudinal dimension thereof.

Figure 2E:
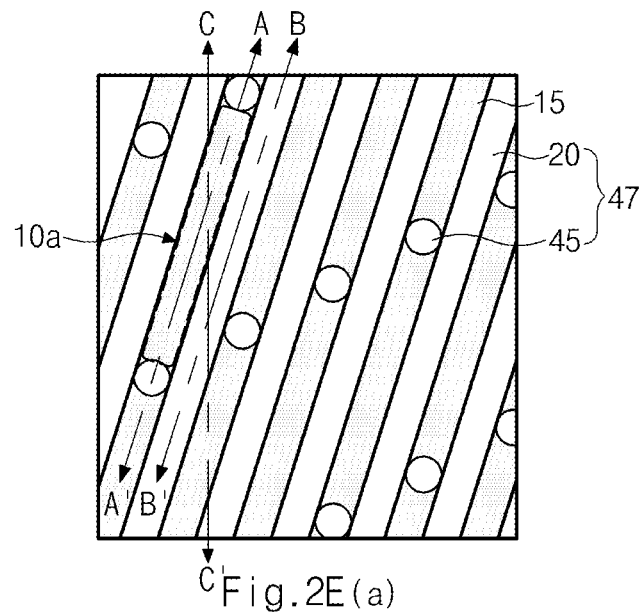
Figure 2E:
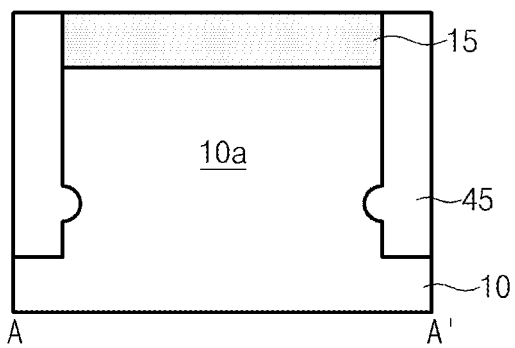
Figure 2E:
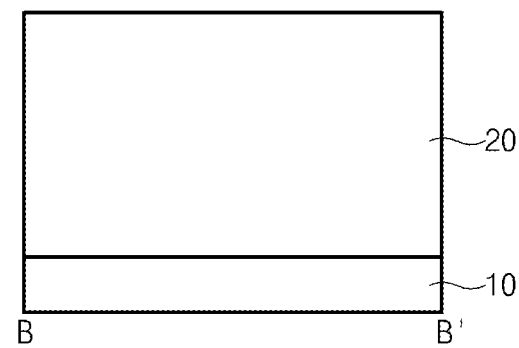
Figure 2E:
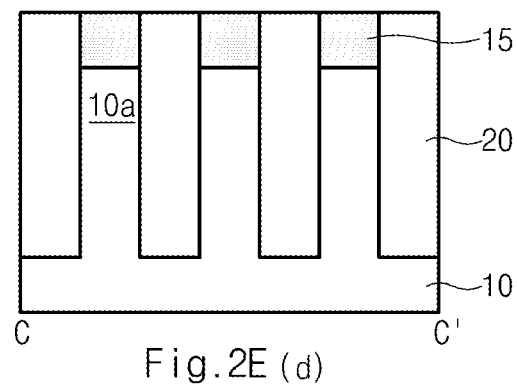

Referring to FIGS. 2E(a) to (d), the first sacrificial film 30a and the spacer 35a are removed. For example, the first sacrificial film 30a and the spacer 35a are removed by dry etching or wet etching. A second insulation film 45 is formed to fill in the second trench 25. Thus, a device isolation film 47 (see FIG. 2E(a)) that includes the second insulation film 45 and the first insulation film 20 is formed. In an embodiment, the first insulation film 20 is in contact with the second insulation film 45. In an embodiment, the second insulation film 45 is formed of the same material as the first insulation film 20. In some embodiments, the second insulation film 45 may be formed of a nitride film, an oxide film, or a combination thereof.

Figure 2F:
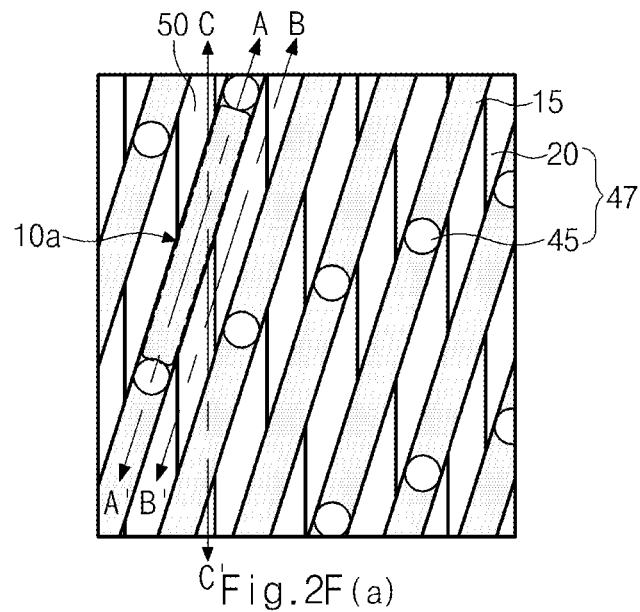
Figure 2F:
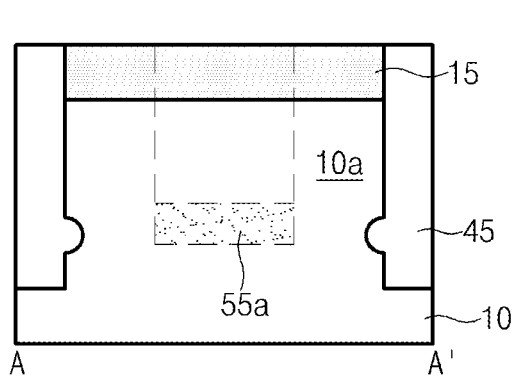
Figure 2F:
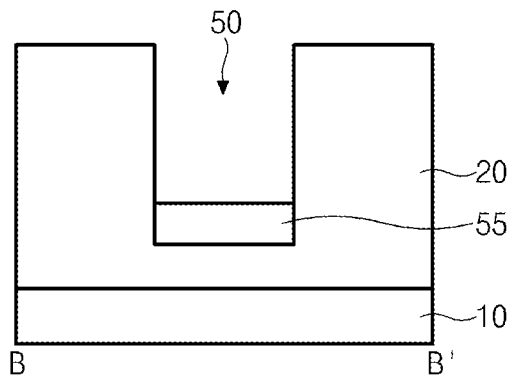
Figure 2F:
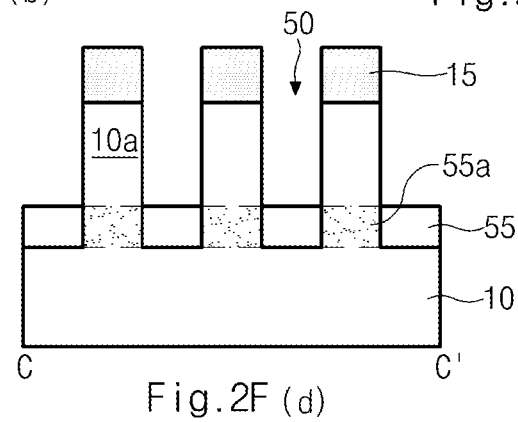

Referring to FIGS. 2F(a) to (d), a third mask pattern (not shown) is formed over the active region 10a and the device isolation film 47 to expose a region in which a bit line will be formed in subsequent processes. In an embodiment, the third mask pattern (not shown) comprises a plurality of lines, each of which crosses the active region 10a. The third mask pattern crosses over end portions of the active region 10a and over the second isolation film 45. As a result, the second isolation film 45 at each end of the active region 10a is protected by the third mask pattern from a subsequent etching process.

In this subsequent etching process, the device isolation film 47 is etched using the third mask pattern (not shown) as an etch mask, such that third trenches are 50 is formed. In this case, due to a difference in etching rates, the active region 10a and the first mask pattern 15 are substantially unetched, while the first insulation film 20 of the device isolation film 47 is etched. The first insulation film 20 may be etched until the third trench 50 has a predetermined depth. For example, the first insulation film 20 may be etched to a predetermined depth such that the bottom surface of the third trench 50 is disposed at substantially the same level as a lower surface of the concave bulb 40. Then, the third mask pattern (not shown) is removed.

Subsequently, a first metal pattern 55 is formed in the third trenches 50. The first metal pattern 55 comprises a plurality of metal films, each of which is disposed in a corresponding the third trench 50. The first metal pattern 55 may be formed using a sputtering process, a Chemical Vapor Deposition (CVD) process, an Atomic Layer Deposition (ALD) process, and the like. The first metal pattern 55 may include a metal that can form a metal-Si alloy (i.e., silicide). In an embodiment, the first metal pattern 55 may include cobalt (Co).

Thereafter, the first metal pattern 55 is thermally treated such that metal ions of the first metal pattern 55 are diffused into the adjoining portions of the active region 10a. As a result, a metal silicide pattern including a plurality of metal silicide films 55a, each formed in a region near the bottom of an active region 10a. In an embodiment, the metal silicide films 55a may be formed of a cobalt silicide material. Thereafter, the first metal pattern 55 is removed.

Figure 2G:
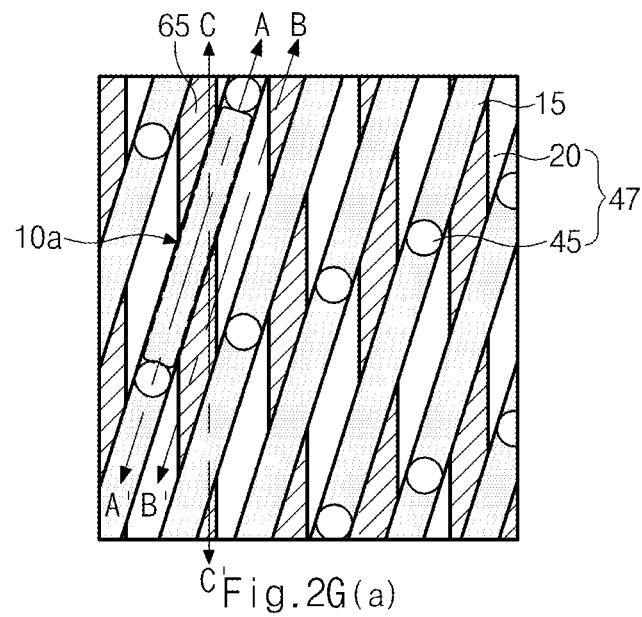
Figure 2G:
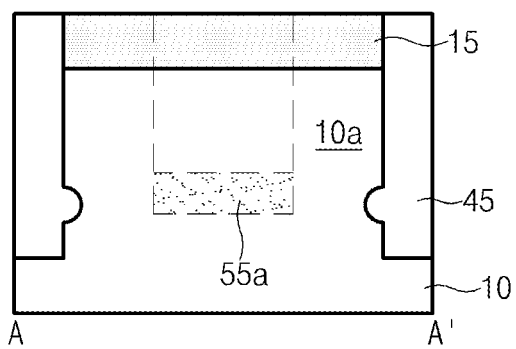
Figure 2G:
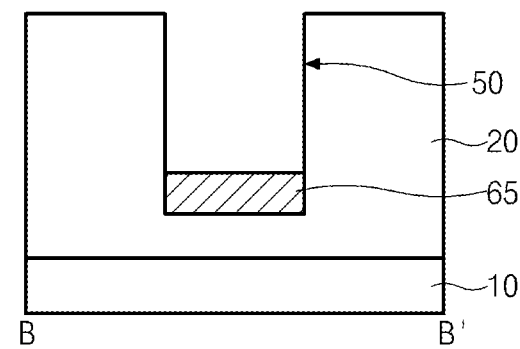
Figure 2G:
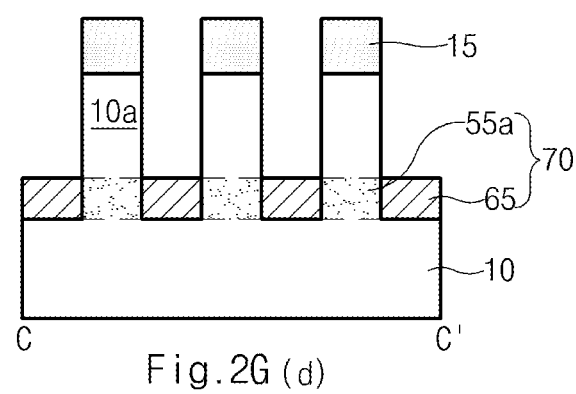

Referring to FIG. 2G(a) to (d), a metal layer (not shown) is formed over the entire surface of the semiconductor substrate 10 including the third trench 50. The metal layer may be formed of a material having low electrical resistance, e.g., tungsten (W). Since some portions of a buried bit line are formed of a low-resistance material, resistance characteristics of the buried bit line may be improved.

After that, a planarization process is carried out until the first mask pattern 15 is exposed. For example, the planarization process may include a chemical mechanical polishing (CMP) process. Subsequently, an etchback process is performed on the resultant structure. After the etchback process, a second metal pattern including a plurality of second metal films remains over the bottom surfaces of the third trenches 50. Each of the second metal pattern 65 is disposed at the bottom of a corresponding third trench, and each having a predetermined thickness as shown in FIGS. 2G(c) and (d). In an embodiment, the remaining second metal pattern 65 may have substantially the same thickness as that of the metal silicide layer 55a. The second metal pattern 65 of the second metal pattern are formed between two metal silicide films 55a, and are formed along a direction of a bit line (e.g., C-C' direction shown in FIG. 2G(a)). That is, the metal silicide films 55a and the second metal pattern 65 are alternately arranged and are electrically connected to form a buried bit line 70.

Figure 2H:
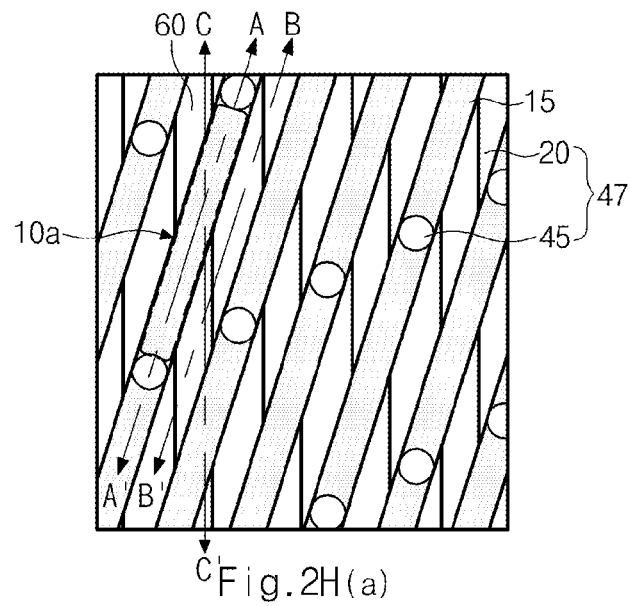
Figure 2H:
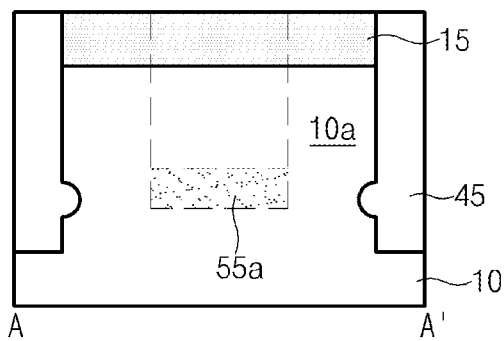
Figure 2H:
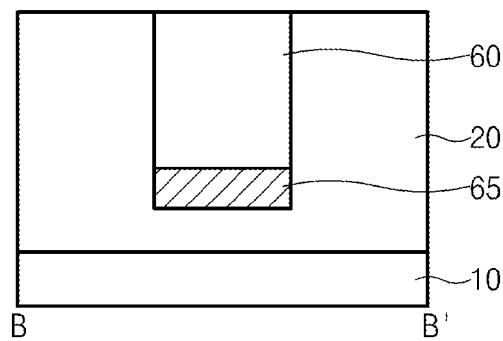
Figure 2H:
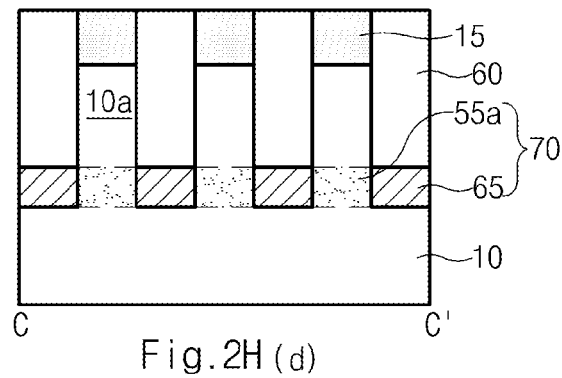

Referring to FIGS. 2H(a) to (d), a third insulation film 60 is formed over the second metal pattern 65 to fill the third trench 50.

As described above, the active region of the semiconductor substrate is substantially unetched while the device isolation region is etched during formation of the buried bit line. As a result, a contact region between the active region and a word line becomes greater in size than when a portion of the active region is etched. Since the contact region is increased, Iop and control capability may be improved, and a storage node contact (SNC) region is increased in size (see FIG. 2H(d)).

Figure 3A:
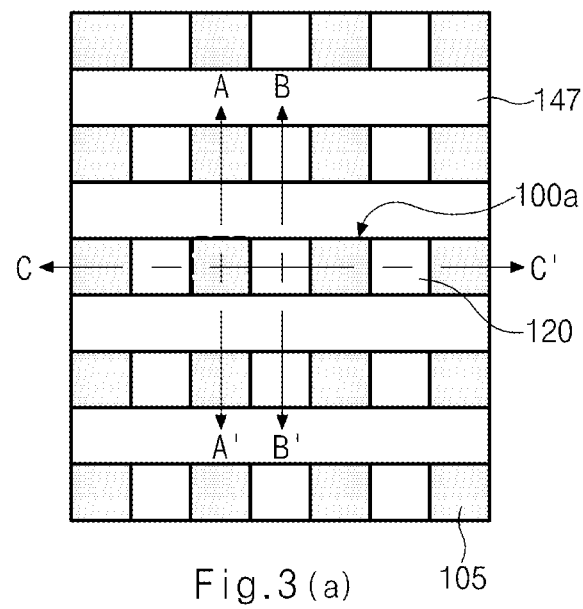
FIG. 3(a) is a plan view and FIGS. 3(b) to 3(d) are cross-sectional views illustrating a semiconductor device according to an embodiment.
Figure 3B:
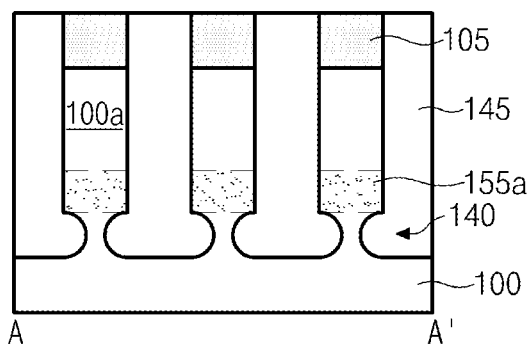
Figure 3C:
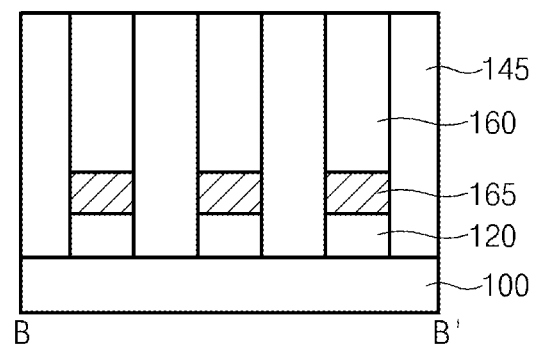
Figure 3D:
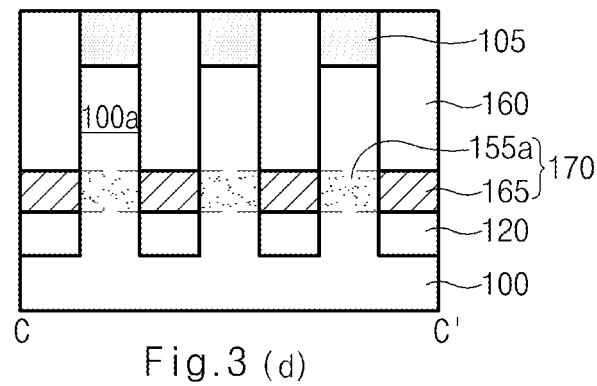

FIG. 3(a) is a plan view illustrating a semiconductor device having a $4F^2$ structure according to an embodiment. FIG. 3(b), FIG. 3(c), and FIG. 3(d) are cross-sectional views illustrating the semiconductor device taken along the line A-A', the line B-B', and the line C-C', respectively, of FIG. 3(a).

Referring to FIG. 3(a), the semiconductor substrate 100 includes a pillar pattern including a plurality of pillars 100a. The plurality of pillars 100a are spaced apart from one another by a predetermined distance such that the plurality of pillars 100a is arranged in the form of a matrix. That is, the pillars 100a are arranged in rows and columns. Referring to FIG. 3(b), a pillar 100a includes a concave bulb 140 at a lower portion of a sidewall of the pillar 100a. A metal silicide pattern comprises a plurality of metal silicide pattern 155a. Viewing FIGS. 3(b) and 3(d) from top to bottom with respect to the orientation of the figures, in an embodiment, a bottom surface of each metal silicide film 155a is located at a vertical level that is substantially the same as or higher than an upper surface of the concave bulb 140. In an embodiment, the metal silicide pattern 155a may include a cobalt silicide (CoSi).

Referring to FIG. 3(d), a metal pattern 165 comprises a plurality of metal films, and each metal film is located below an insulation film 160 between the pillars 100a arranged along the direction of the line C-C'. In an embodiment, the metal pattern 165 may include tungsten (W), which serves as a low-resistance material. However, embodiments are not limited thereto, and other low-resistance materials may be used. The metal pattern 165 are located at substantially the same level as that of the metal silicide pattern 155a. As a result, a metal film 165 is electrically coupled to two adjoining metal silicide pattern 155a. That is, the metal silicide pattern 155a and the metal pattern 165 are alternately arranged and electrically coupled to form a buried bit line 170.

Figure 4A:
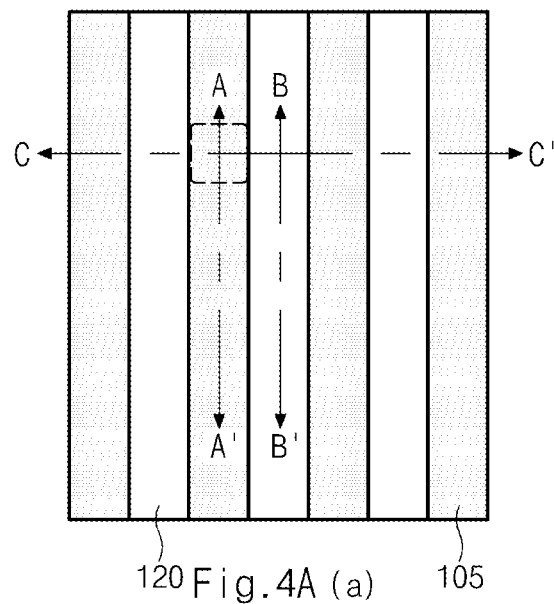
FIGS. 4A(a), 4B(a), 4C(a), 4D(a), 4E(a), 4F(a), 4G(a), and 4H(a) are plan views illustrating a method of forming a semiconductor device according to an embodiment.
Figure 4A:
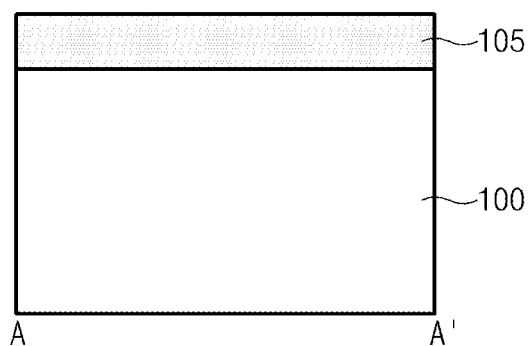
Figure 4A:
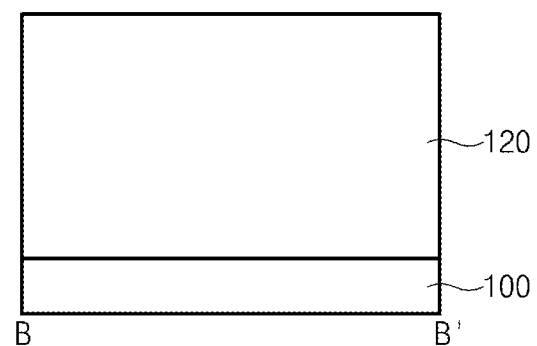
Figure 4A:
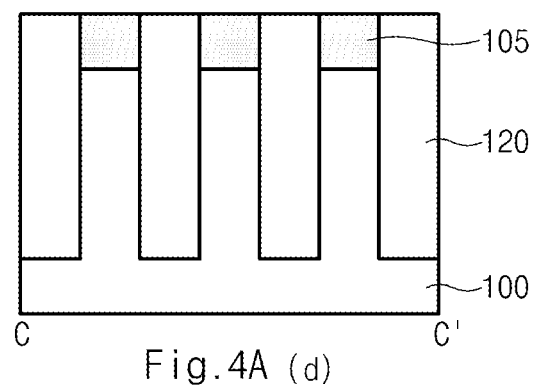

FIGS. 4A(a) to 4H(d) are plan views and cross-sectional views illustrating a method of forming a semiconductor device having a $4F^2$ structure according to the embodiment shown in FIGS. 3A(a) to (d). In each group of FIGS. 4A to 4H, (a) is a plan view illustrating the semiconductor device, (b) is a cross-sectional view illustrating the semiconductor device taken along the line A-A' of Fig. (a), (c) is a cross-sectional view illustrating the semiconductor device taken along the line B-B' of Fig. (a), and (d) is a cross-sectional view illustrating the semiconductor device taken along the line C-C' of Fig. (a).

Referring to FIGS. 4A(a) to (d), a first mask pattern 105 is formed over the semiconductor substrate 100 as a line pattern. In an embodiment, the first mask pattern 105 may be formed of an oxide film, a nitride film, or a combination thereof. The semiconductor substrate 100 is etched using the first mask pattern 105 as an etch mask so that first trenches (not shown) are formed. A first insulation film 120 is formed to fill the first trenches (not shown). In an embodiment, the first insulation film 120 may be formed of a nitride film, an oxide film, or a combination thereof.

Referring to FIGS. 4B(a) to (d), a second mask pattern (not shown) is formed such that the second mask pattern and the first mask pattern 105 cross each other. In an embodiment, the first mask pattern 105 and the second mask pattern (not shown) are perpendicular to each other. Using the second mask pattern (not shown) as an etch mask, the semiconductor substrate 100 and the first mask pattern 105 are etched to form second trenches 125 defining a plurality of pillars 100a. As a result, a $4F^2$ semiconductor device may be formed. The plurality of pillars 100a are spaced apart from one another by a predetermined distance, such that the plurality of pillars 100a are arranged in the form of a matrix. In other words, the pillars 100a are arranged to form one or more rows and columns.

Figure 4C:
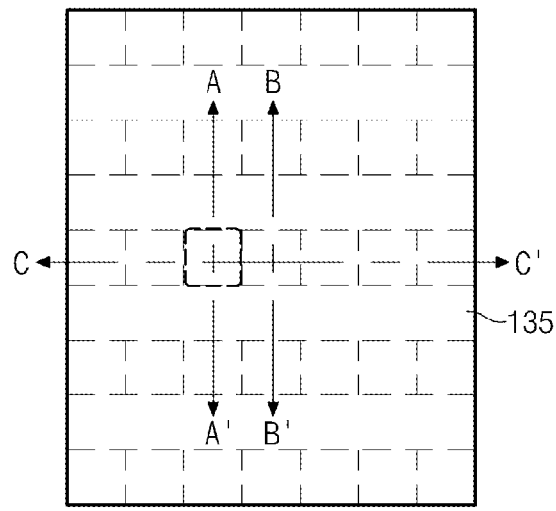
Figure 4C:
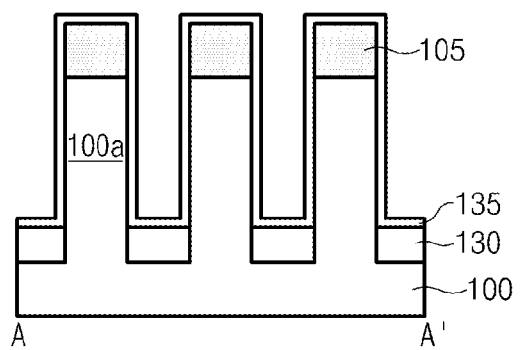
Figure 4C:
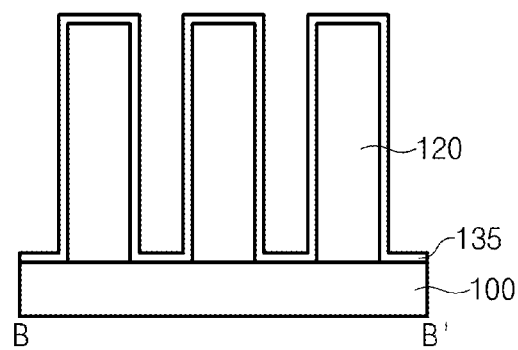
Figure 4C:
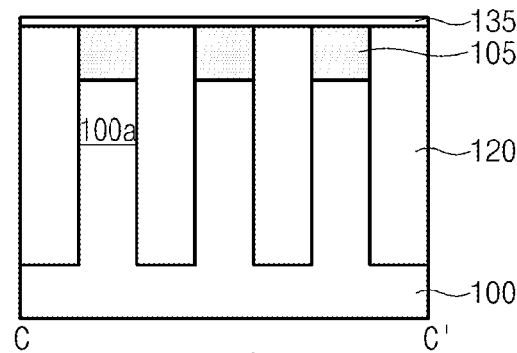

Referring to FIGS. 4C(a) to (d), a sacrificial film 130 is formed on the bottom surface of the second trench 125. In an embodiment, the sacrificial film 130 may include an oxide film, a nitride film, a silicon film, or a combination thereof. A spacer layer 135 is formed over an entire surface of the semiconductor substrate 100, including the sacrificial film 130. In an embodiment, the spacer layer 135 may include a nitride film.

Figure 4D:
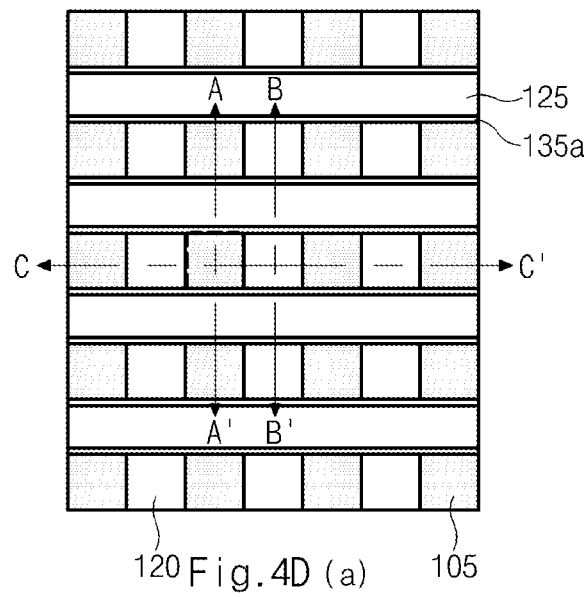
Figure 4D:
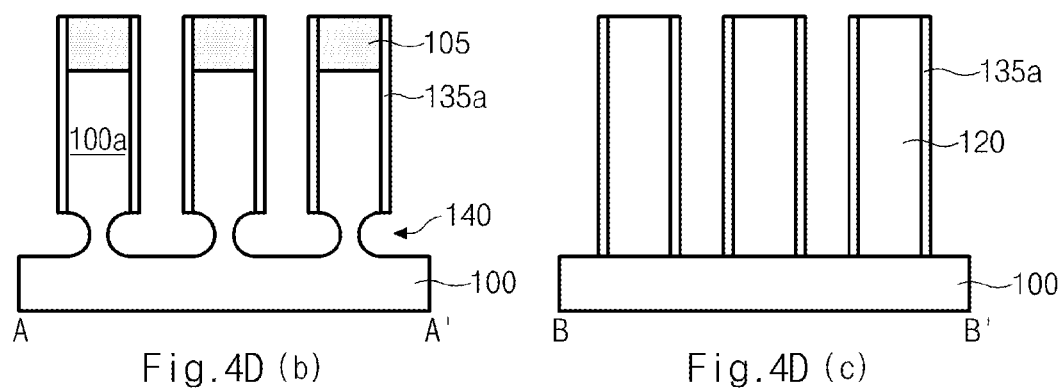
Figure 4D:
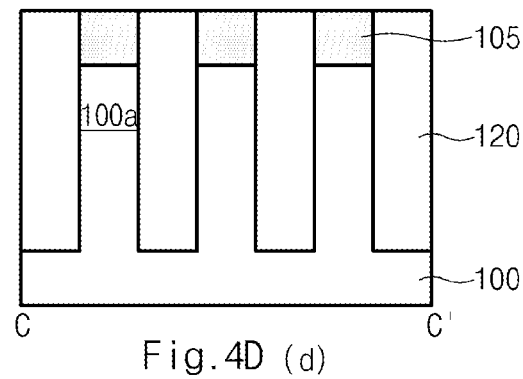

Referring to FIGS. 4D(a) to (d), the spacer layer 135 is etched by an etchback process to form a spacer 135a over sidewalls of the pillars 100a and the first insulation film 120.

Subsequently, the sacrificial film 130 formed on the bottom surface of the second trench 125 is removed. For example, the sacrificial film 130 may be removed by dry etching or wet etching. Due to the removal of the sacrificial film 130, lower portions of the sidewall of the pillars 100a are exposed. The exposed portions of the pillars 100a are further etched, so that two concave bulbs 140 are formed at bottom portions of opposing sidewalls of each pillar 100a, as shown in FIG. 4D(b). Since the concave bulb 140 is formed as described above, the distance between two adjacent buried bit lines becomes greater, thereby reducing parasitic capacitance (Cb) between the buried bit lines.

Figure 4E:
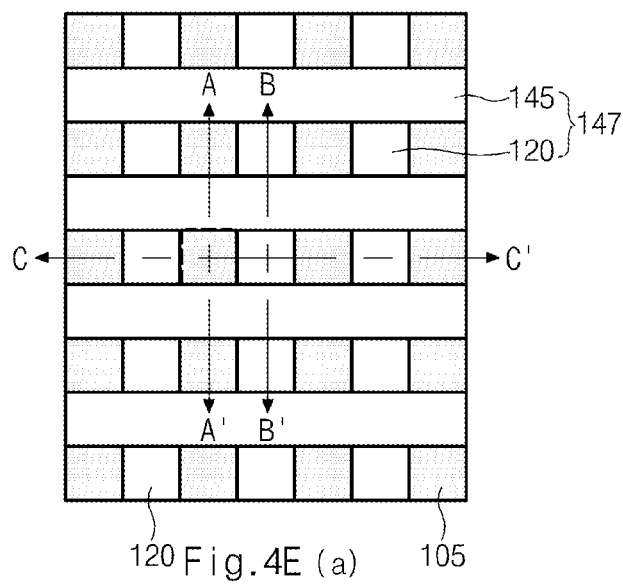
Figure 4E:
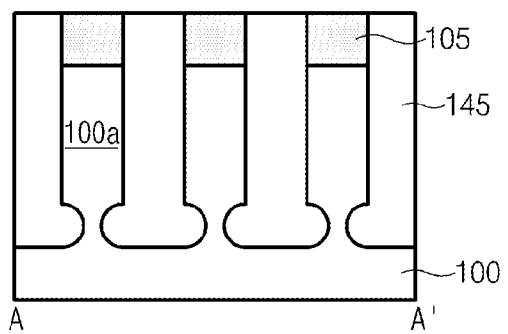
Figure 4E:
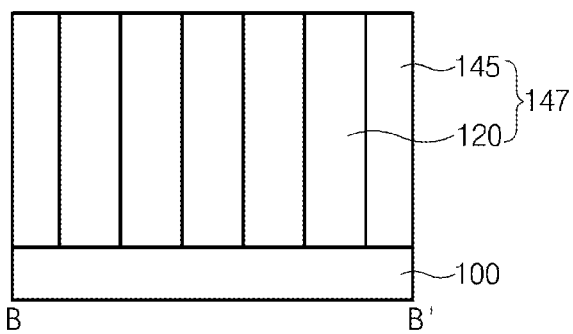
Figure 4E:
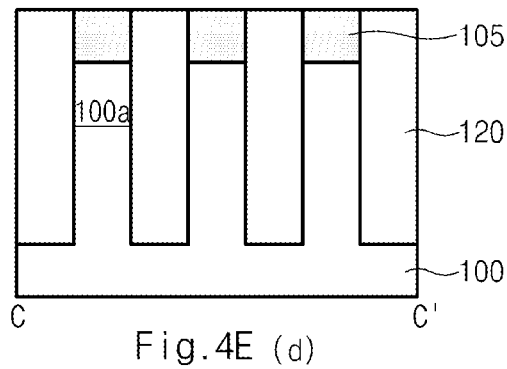

Referring to FIGS. 4E(a) to (d), after removing the spacer 135a, a second insulation film 145 is formed to fill the second trench 125, so that a device isolation film 147 is formed. The device isolation film 147 includes the second insulation film 145 and the first insulation film 120.

Figure 4F:
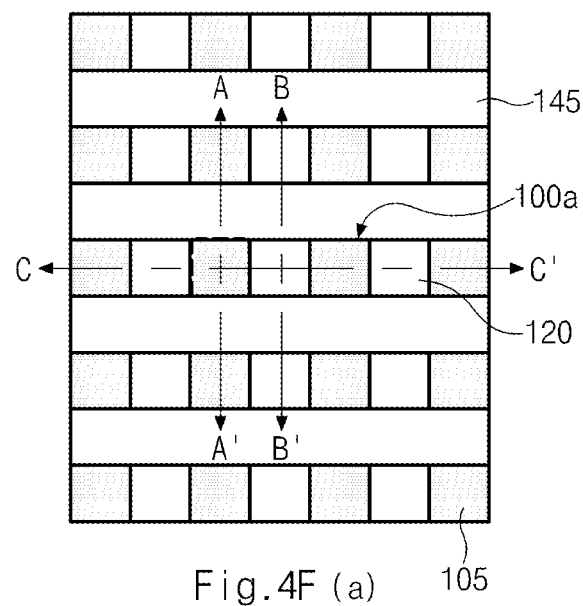
Figure 4F:
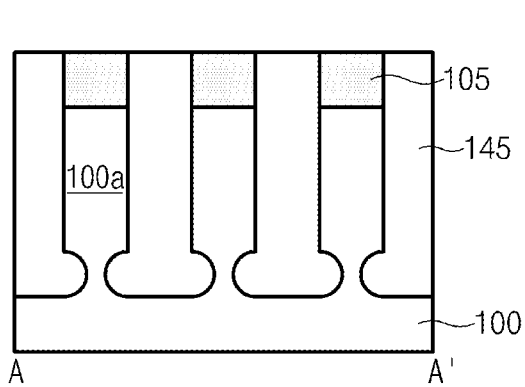
Figure 4F:
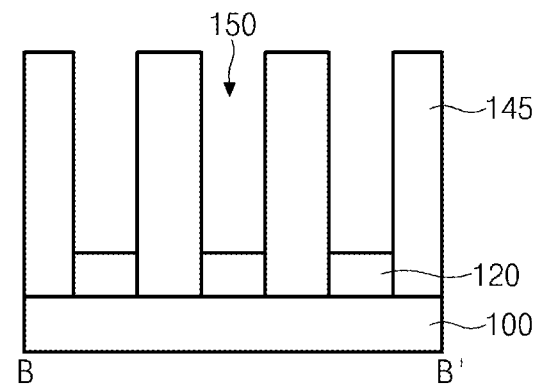
Figure 4F:
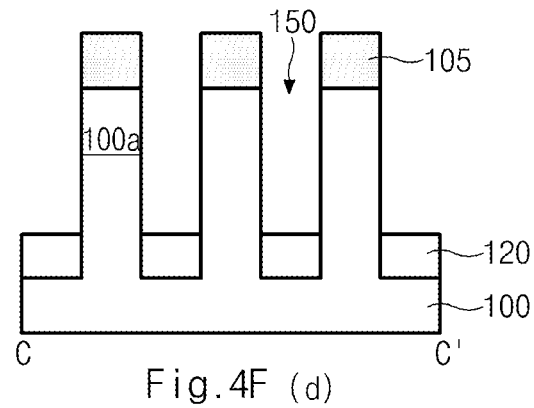

Referring to FIGS. 4F(a) to (d), the first insulation film 120 is disposed between the adjacent pillars 100a and extends along a line that is parallel to the C-C' line. The first insulation film 120 is etched so that third trenches 150 are formed. The remaining first insulation film 120 fills the lower portion of the third trench 150 and has a predetermined thickness. In an embodiment, an upper surface of the first insulation film 120 is disposed at substantially the same level as an upper surface of the concave bulb 140.

Figure 4G:
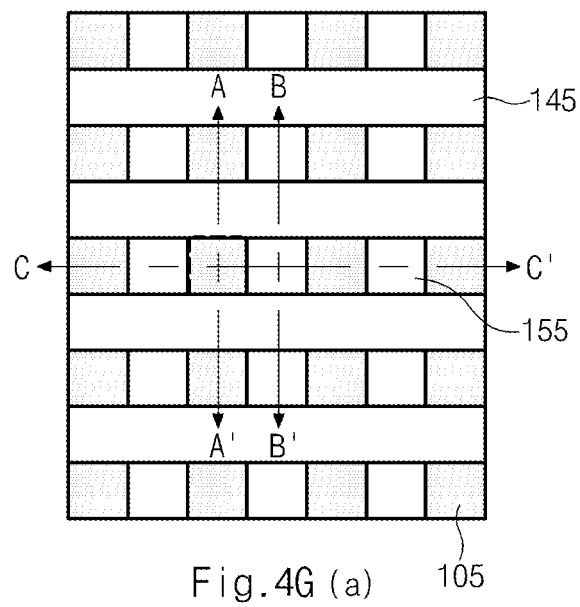
Figure 4G:
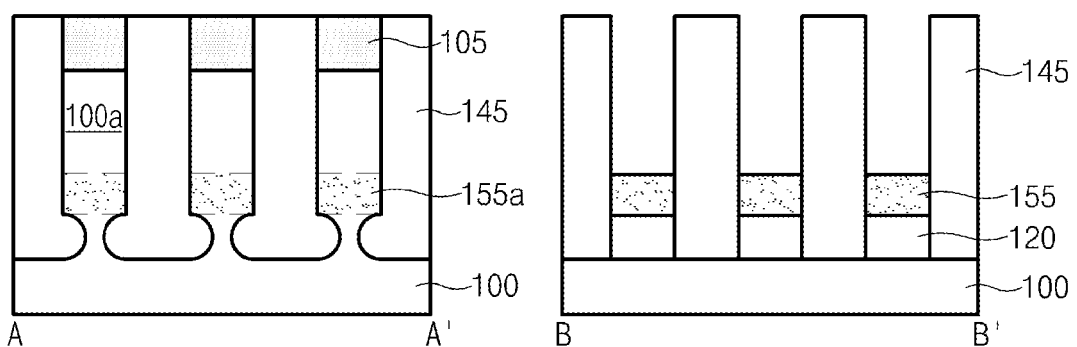
Figure 4G:
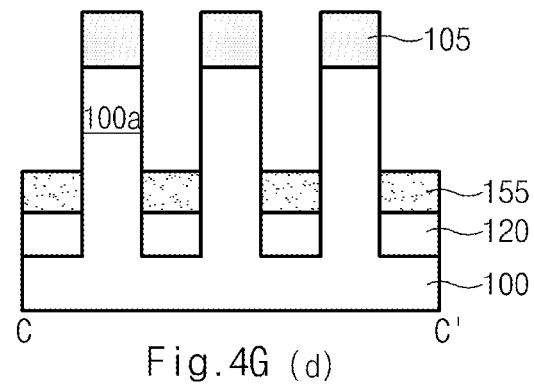

Referring to FIGS. 4G(a) to (d), a first metal pattern 155 is formed in the third trench 150. The first metal pattern 155 may be formed using a sputtering process, a Chemical Vapor Deposition (CVD) process, an Atomic Layer Deposition (ALD) process, and the like. The first metal pattern 155 may include a metal that can form a metal-Si alloy (i.e., silicide). In an embodiment, the first metal pattern 155 may include cobalt (Co).

Thereafter, the first metal pattern 155 is thermally treated, such that metal ions of the first metal pattern 155 are diffused into the adjoining portions of the pillar pattern 100a. As a result, a metal silicide pattern 155a including a plurality of metal silicide films is formed at the bottom of the pillar pattern 100a. The metal silicide pattern 155a may be located over the concave bulbs 140 formed at the bottom of the pillars 100a. In an embodiment, the bottom surface of a metal silicide film 155a is disposed over an upper surface of a concave bulb 140. In an embodiment, the metal silicide pattern 155a may be formed of a cobalt silicide material.

Figure 4H:
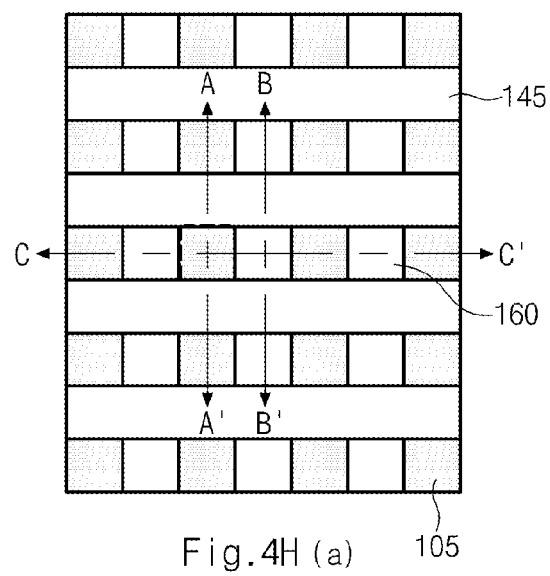
Figure 4H:
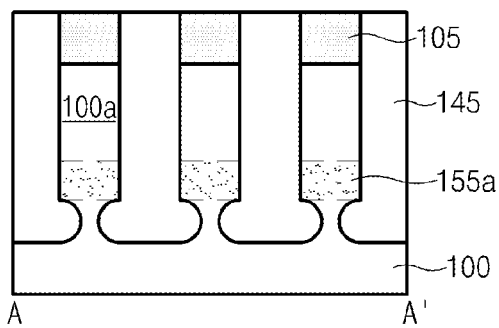
Figure 4H:
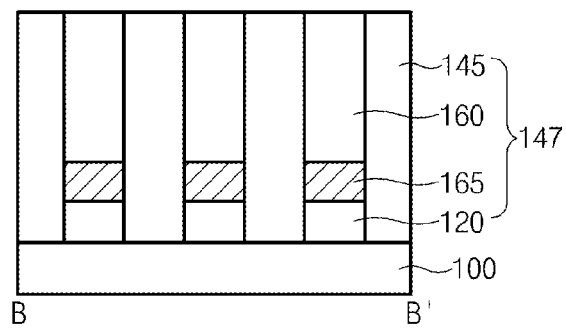
Figure 4H:
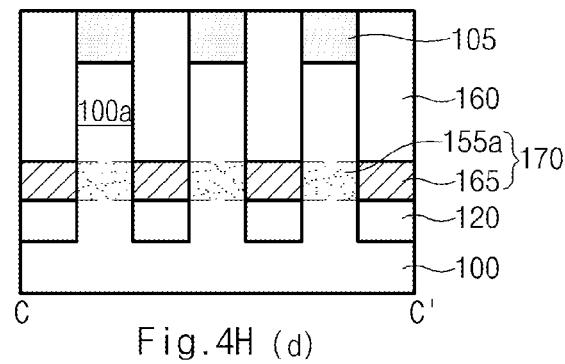

Referring to FIGS. 4H(a) to (d), the first metal pattern 155 is removed. A metal layer (not shown) is formed over the entire surface of the semiconductor substrate 100 including the third trench 150. The metal layer may be formed of a material having low electrical resistance, e.g., tungsten (W).

After that, a planarization process is carried out until the first mask pattern 105 is exposed. Subsequently, an etchback process is performed on the resultant structure. After the etchback process, portions of the metal layer remain over the bottom surface of the third trench 150, thus forming a second metal pattern that includes a plurality of second metal films 165, as shown in FIGS. 4H(c) and (d). Each of the second metal pattern 165 is disposed in a corresponding third trench 150 and has a predetermined thickness as shown in FIGS. 4H(c) and (d). In an embodiment, the second metal pattern 165 may have substantially the same thickness as that of the metal silicide layer 155a. The second metal pattern 165 is formed between two metal silicide pattern 155a along the direction of a bit line (e.g., parallel to the line C-C' in FIG. 4H(a)). That is, the metal silicide pattern 155a and the second metal pattern 165 are alternately arranged and are electrically coupled to form a buried bit line 170. A third insulation film 160 is formed to fill the third trench 150 over the second metal pattern 165.

In the above-described embodiment, the bit line contact region is formed of a metal silicide pattern, and the remaining bit line region other than the bit line contact region is formed of a low-resistance material. A semiconductor device according to an embodiment can address issue that may result from the aggregation of metal silicide in a conventional buried bit line. Thus, the occurrence of a bit line failure can be prevented.

In addition, when the metal silicide pattern is formed in the pillars, the pillars are supported by insulation films. As a result, a bending or a leaning of the pillars may be prevented.

Figure 5A:
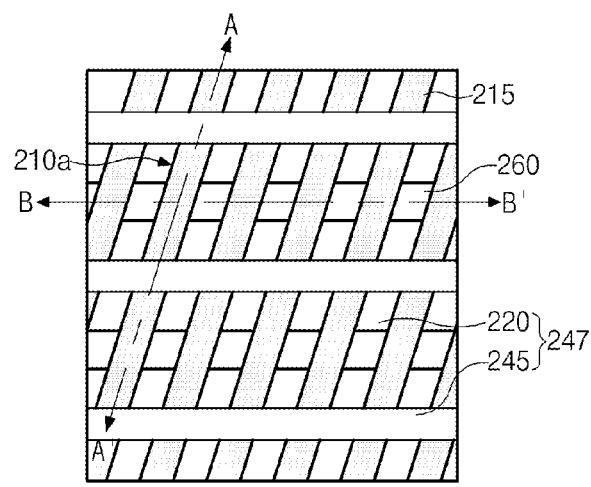
FIG. 5(a) is a plan view and FIGS. 5(b) and 5(c) are cross-sectional views illustrating a semiconductor device according to an embodiment.
Figure 5B:
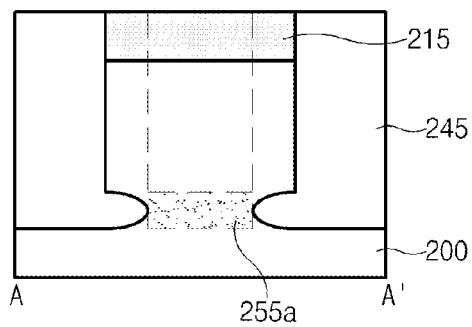
Figure 5C:
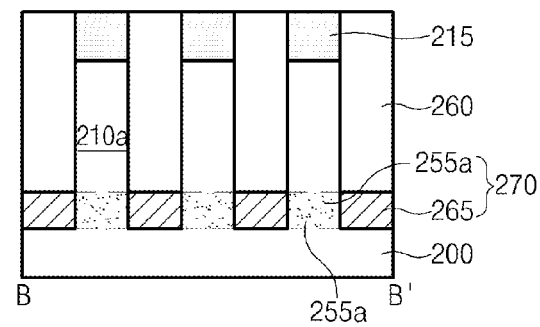

FIG. 5(a) is a plan view illustrating a semiconductor device according to an embodiment. FIG. 5(b) and FIG. 5(c) are cross-sectional views illustrating the semiconductor device taken along the line A-A' and the line B-B' of FIG. 5(a), respectively.

Referring to FIG. 5(a), the semiconductor device according to an embodiment includes a semiconductor substrate 200 including an active region 210a and a device isolation film 247. The active region 210a may extend along a line in a line pattern. The active regions 210a in the line pattern may be tilted at a predetermined angle with respect to the vertical axis of FIG. 5(a). A concave bulb 240 is located at the bottom of the sidewall of the active region 210a.

A metal silicide pattern comprises a plurality of metal silicide films 255a, and each metal silicide film 255a is located at the bottom of the active region 210a. In a plan view, the metal silicide pattern 255a is located in a center portion of the length of the active region 210a and serves as the bit line contact region.

Referring to FIG. 5(b), the metal silicide pattern 255a may be disposed at substantially the same level as the concave bulb 240. In an embodiment, the top surface of the metal silicide film 255a is disposed at substantially the same level as an upper surface of the concave bulb 240. In an embodiment, the bottom surface of the metal silicide film 255a is disposed at substantially the same level as a lower surface of the concave bulb 240. In other words, the metal silicide film 255a is substantially aligned with the concave bulb 40. In an embodiment, the metal silicide pattern 255a may include a cobalt silicide material.

The semiconductor device also includes a metal pattern 265 comprising a plurality of metal films, and each the metal pattern 265 is located at the bottom of a third insulation film 260 of the device isolation film 247. In an embodiment, the metal pattern 265 may include tungsten (W), which serves as a low-resistance material. The metal pattern 265 is located in a bit line region, adjoining the bit line contact region, and is disposed at substantially the same level as the metal silicide pattern 255a. As a result, the metal silicide pattern 255a is electrically coupled to two adjacent metal patterns 265. In other words, the metal silicide films 255a and the metal patterns 265 are alternate with each other and are electrically coupled to form a buried bit line 270.

Figure 6A:
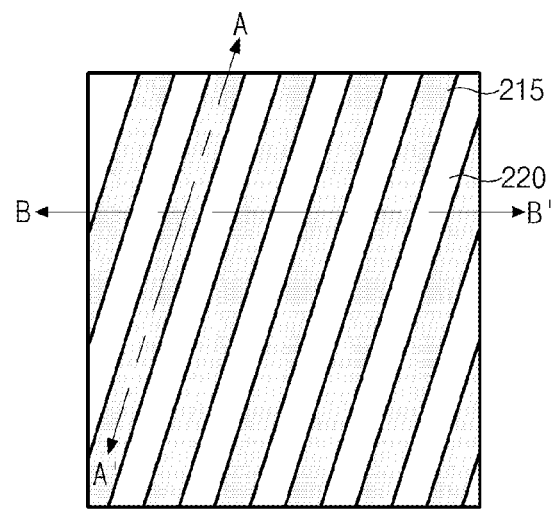
FIGS. 6A(a), 6B(a), 6C(a), 6D(a), 6E(a), 6F(a), 6G(a) and 6H(a) are plan views illustrating a method of forming a semiconductor device according to an embodiment.
Figure 6A:
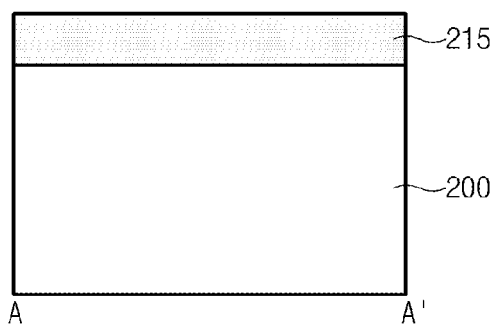
Figure 6A:
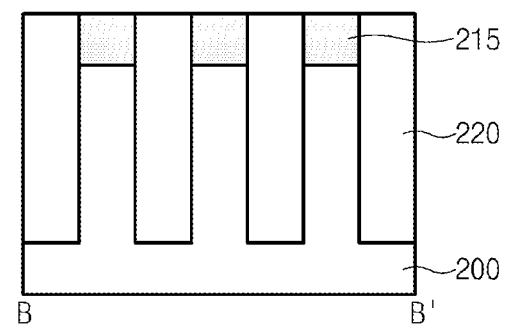

FIGS. 6A(a) to 6H(c) are plan views and cross-sectional views illustrating a method for forming a semiconductor device according to the embodiment shown in FIGS. 5A(a) to (c). In each group of FIGS. 6A to 6H, (a) is a plan view illustrating the semiconductor device according to an embodiment, (b) is a cross-sectional view illustrating the semiconductor device taken along the line A-A' of (a), and (c) is a cross-sectional view illustrating the semiconductor device taken along the line B-B' of (a).

Referring to FIGS. 6A(a) to (c), a first mask pattern 215 exposing a device isolation film is formed over the semiconductor substrate 200. In an embodiment, the first mask pattern 215 may include a nitride film. The first mask pattern 215 comprises a plurality of mask pattern lines, which are tilted at a predetermined angle with respect to the vertical axis of FIG. 6a(a).

Thereafter, the semiconductor substrate 200 is etched using the first mask pattern 215 as an etch mask so that first trenches (not shown) are formed. A first insulation film 220 is formed to fill the first trenches (not shown). In an embodiment, the first insulation film 220 may be formed of a nitride film, an oxide film, or a combination thereof.

Figure 6B:
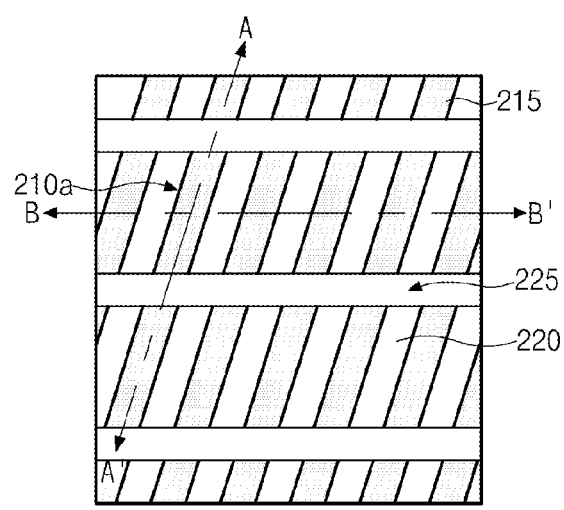
Figure 6B:
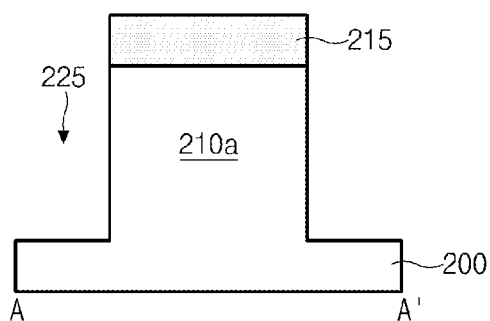
Figure 6B:
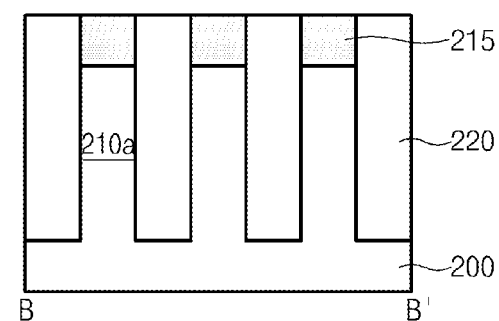

Referring to FIGS. 6B(a) to (c), a second mask pattern (not shown) formed in line shapes that cross the first mask pattern 215. The second mask pattern (not shown) is used as a cutting mask which defines a longitudinal dimension of the active region by cutting a mask pattern line to expose a specific region of the substrate 200 in which a portion of a device isolation region will be formed. Since the cutting mask is formed in a line shape, the etching process may become simplified.

Thereafter, the first mask pattern 215 and the semiconductor substrate 210 are etched using the second mask pattern (not shown) as an etch mask, so that second trenches 225 are formed. Thus, as shown in FIG. 6B(b), an active region 210a defined by two adjacent second trenches 225 is formed.

Figure 6C:
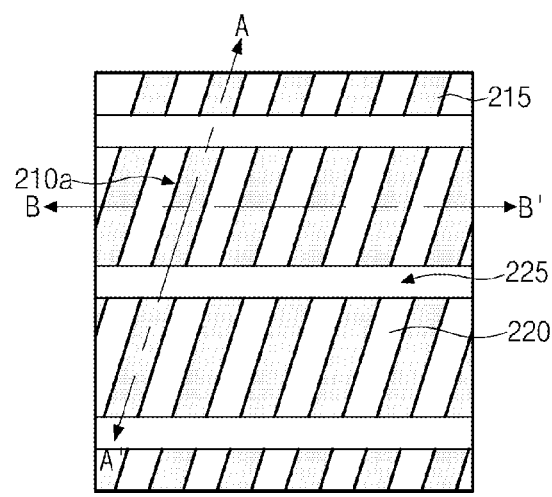
Figure 6C:
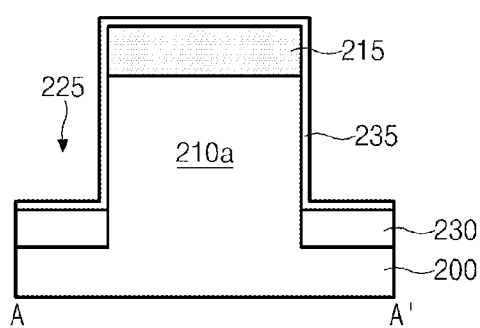
Figure 6C:
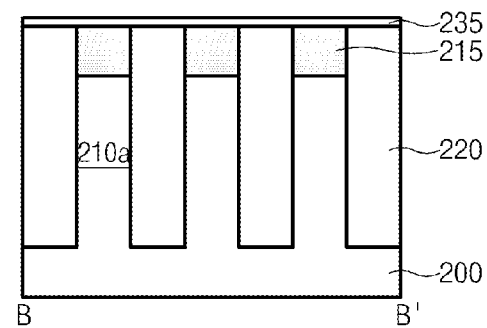

Referring to FIGS. 6C(a) to (c), a sacrificial film 230 is formed over the bottom surface of the second trench 225. In an embodiment, the sacrificial film 230 may include a nitride film, an oxide film, and/or a silicon film.

Thereafter, a spacer layer 235 is formed over the entire surface of the semiconductor substrate 200 including the second sacrificial film 230a and the first mask pattern 215, as shown in FIG. 6C(b). In an embodiment, the spacer layer 235 may be formed of a nitride film.

Figure 6D:
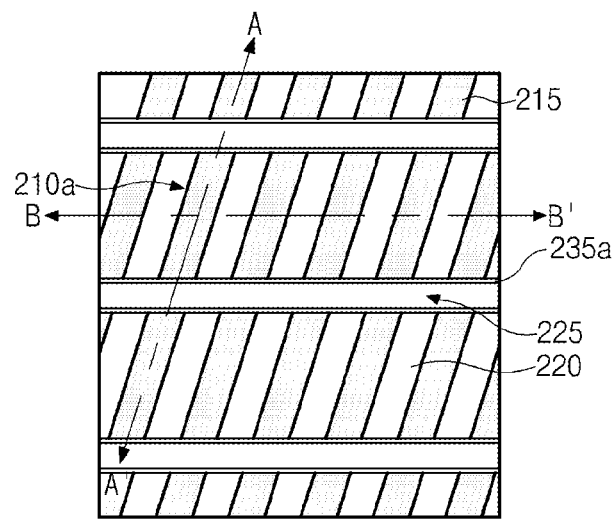
Figure 6D:
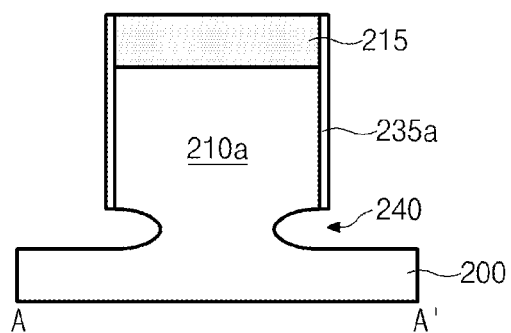
Figure 6D:
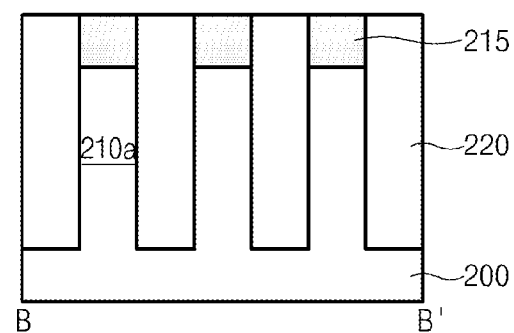

Referring to FIG. 6D(a) to (c), an etchback process is carried out to remove portions of the spacer layer 235. As a result, a spacer 235a is formed at an inner sidewall of the second trench 225. The sacrificial film 230 may be removed during or after formation of the spacer 235a. When the sacrificial film 230 is removed, a portion of the semiconductor substrate 200 and a lower portion of the inner sidewall of the second trench 225 is exposed. The exposed sidewall is further etched, so that two concave bulbs 240 are formed at the lower portions of opposing sides of the longitudinal dimension of the active region 210a, which extends parallel to the line A-A'. In an embodiment, the concave bulb 240 is etched until the innermost portion of the concave bulb 240 reaches a portion in which the bit line contact region will be formed.

Figure 6E:
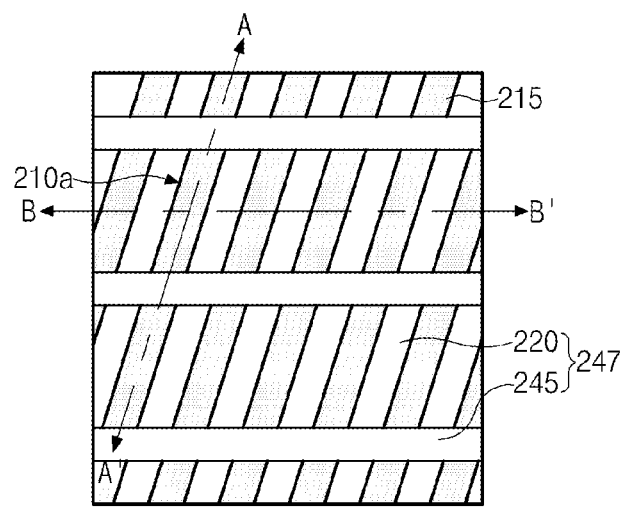
Figure 6E:
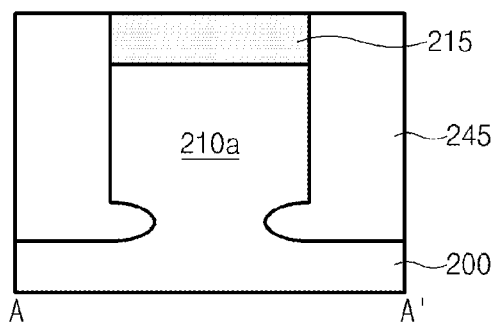
Figure 6E:
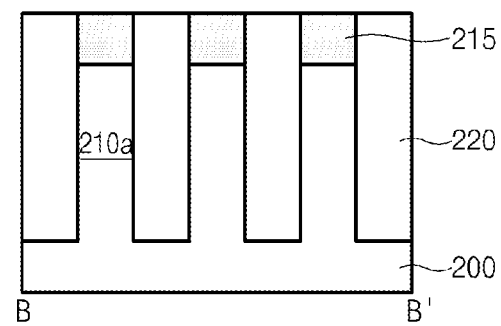

Referring to FIG. 6E(a) to (c), the sacrificial film 230 and the spacer 235a are removed. For example, the sacrificial film 230a and the spacer 235a are removed by dry etching or wet etching. A second insulation film 245 is formed to fill the second trench 225 so that a device isolation film 247 is formed. The device isolation film 247 includes the second insulation film 245 and the first insulation film 220. In an embodiment, the second insulation film 245 may be formed of the same material as the first insulation film 220. In an embodiment, the second insulation film 245 may be formed of a nitride film, an oxide film, or a combination thereof.

Figure 6F:
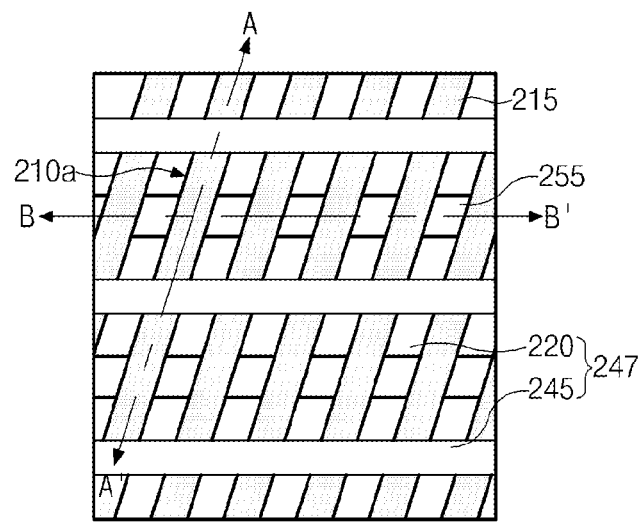
Figure 6F:
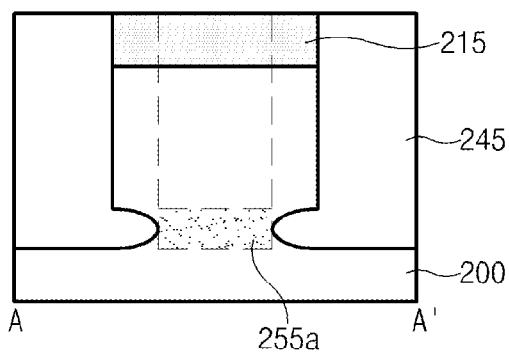
Figure 6F:
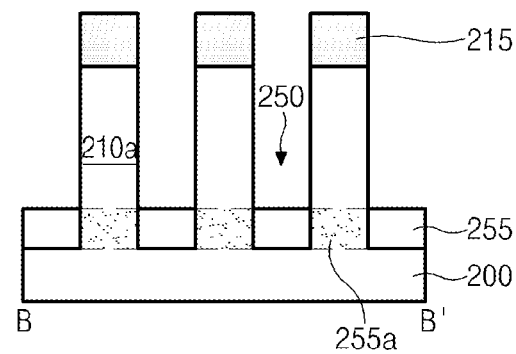

Referring to FIGS. 6F(a) to (c), a third mask pattern (not shown) is formed over the active region 210a and the device isolation film 247 to expose a region in which a bit line will be formed in subsequent processes. In an embodiment, the third mask pattern (not shown) comprises a plurality of lines, each of which crosses the active region 210a, and extend in the B-B' direction to cross a center portion of the active region 210a. Subsequently, the device isolation film 247 is etched using the third mask pattern (not shown) as an etch mask, such that third trenches 250 are formed. In this etching process, due to a difference in etching rates, the active region 210a and the first mask pattern 215 are substantially unetched, while the first insulation film 220 of the device isolation film 247 is etched. The first insulation film 220 may be etched until the third trench 250 has a predetermined depth. For example, the first insulation film 220 may be etched to a predetermined depth such that the bottom surface of the third trench 250 is disposed at substantially the same level as a lower surface of the concave bulb 240. Then, the third mask pattern (not shown) is removed.

Subsequently, a first metal pattern 255 is formed in the third trench 250. The first metal pattern 255 may be formed using a sputtering process, a Chemical Vapor Deposition (CVD) process, an Atomic Layer Deposition (ALD) process, and the like. The first metal pattern 255 is disposed in a lower portion of the trench 250. The first metal pattern 255 are disposed at substantially the same level as the concave bulb such that they are substantially aligned with concave bulbs 240. For example, in an embodiment, the bottom surface of the first metal pattern 255 are disposed at substantially the same level as a lower surface of the concave bulbs 240 and the top surface of the first metal films are disposed at substantially the same level as an upper surface of the concave bulbs 240. The first metal pattern 255 may include a metal that can form a metal-Si alloy (i.e., silicide). In an embodiment, the first metal pattern 255 may include cobalt (Co).

Thereafter, the first metal pattern 255 is thermally treated such that metal ions of the first metal pattern 255 are diffused into the adjoining portions of the active region 210a. As a result, a metal silicide pattern including a plurality of metal silicide films is formed at the bottom of the active region 210a. In an embodiment, each metal silicide pattern 255a is disposed between two opposing concave bulbs 240 of the active region 210a. In an embodiment, the metal silicide pattern 255a may be formed of a cobalt silicide material. Thereafter, the first metal pattern 255 is removed.

Figure 6G:
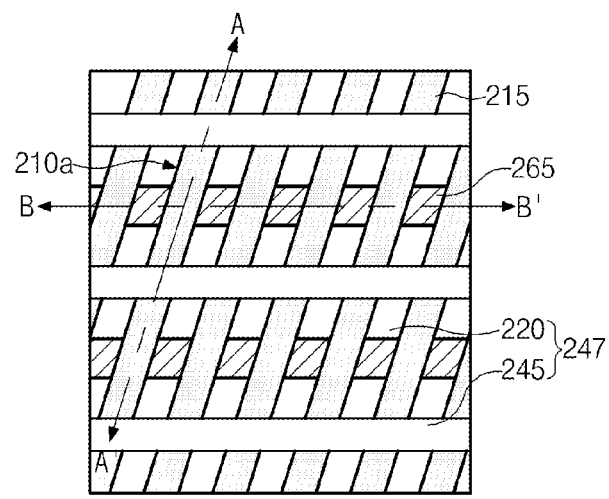
Figure 6G:
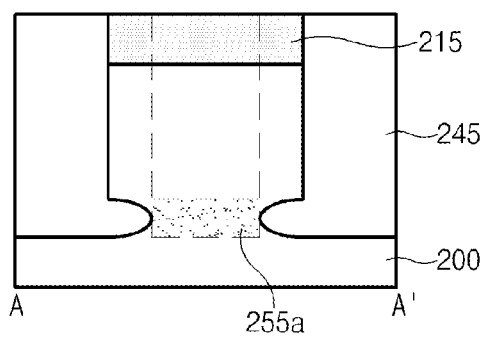
Figure 6G:
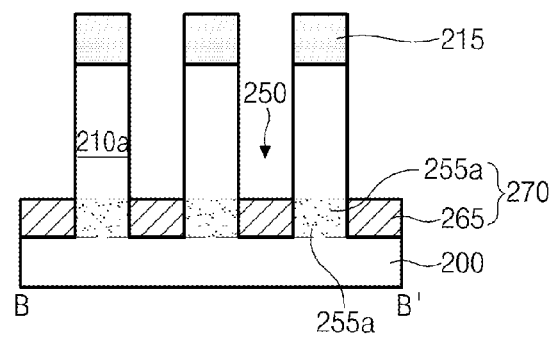

Referring to FIGS. 6G(a) to (c), a metal layer is formed over the entire surface of the semiconductor substrate 200 including the third trench 250. The metal layer may be formed of a material having low electrical resistance, e.g., tungsten (W). Since some portions of a buried bit line are formed of such a low-resistance material, resistance characteristics of the buried bit line may be improved.

After that, a planarization process is carried out until the first mask pattern 215 is exposed. For example, the planarization process may include a chemical mechanical polishing (CMP) process. Subsequently, an etchback process is performed on the resultant structure. After the etchback process, the second metal pattern 265 remain at the lower portion of the third trench 250 to have a predetermined thickness as shown in FIG. 6G(c). In an embodiment, the remaining second metal pattern 265 may have substantially the same thickness as that of the metal silicide pattern 255a. The second metal pattern 265 includes a plurality of second metal films, each of which is formed between two metal silicide films 255a along the direction of a bit line (e.g., in the direction of the line B-B' shown in FIG. 5G(a)). That is, the metal silicide pattern 255a and the second metal pattern 265 are arranged to alternate with each other and are electrically coupled to form a buried bit line 270.

Figure 6H:
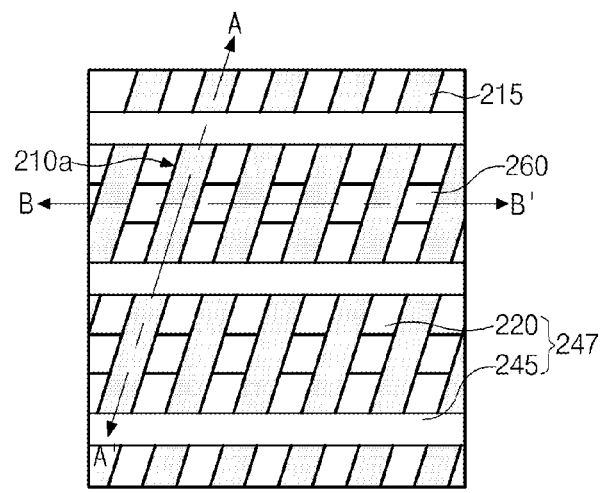
Figure 6H:
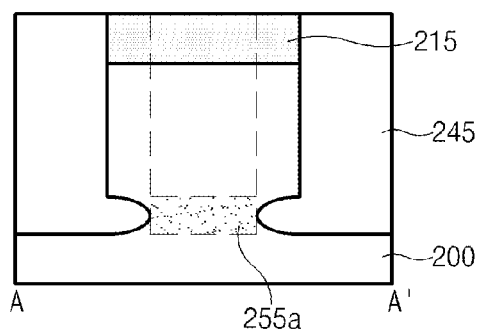
Figure 6H:
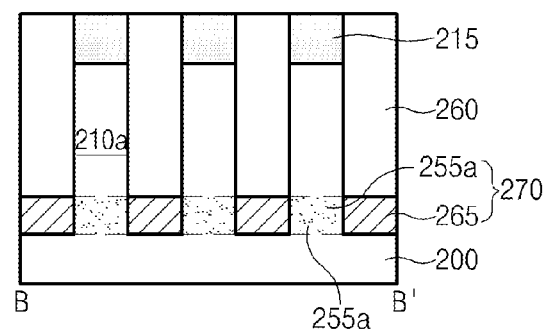

Referring to FIGS. 6H(a) to (c), a third insulation film 260 is formed over the second metal pattern 265 to fill in the third trench 250.

As described above, the active region of the semiconductor substrate is substantially unetched while the device isolation region is etched during formation of the buried bit line. As a result, the size of a contact region between the active region and a word line is greater than a contact region that results when a portion of the active region is etched. Since the size of the contact region has been increased, Iop and control capability may be improved, and a storage node contact (SNC) region is increased in size (see FIG. 6H(c)).

According to an embodiment of a semiconductor device, a buried bit line includes metal silicide patterns and metal patterns, which are arranged to alternate with each other and are electrically coupled to each other.

In a semiconductor device in accordance with an embodiment, bit line contact portions of the buried bit line are formed of a metal silicide pattern. The remaining portions of the bit line may be formed of a low-resistance material. As a result of this configuration, aggregation of metal silicide materials in the buried bit line can be prevented, and reliability of the semiconductor device can be improved.

In addition, in accordance with an embodiment, a process that is usually used in fabricating a bit line mask to form a conventional buried bit line in the 6F$^2$ cell structure can be omitted. As a result, production costs of the semiconductor device according to an embodiment may be reduced.

In a semiconductor device in accordance with an embodiment, since a buried bit line is formed in an active region or a pillar pattern, fabrication process of the semiconductor device according to an embodiment may be simplified.

In a semiconductor device in accordance with an embodiment, since a concave bulb is formed in an active region or pillar pattern including a buried bit line such that a distance between two adjacent buried bit lines is increased, thereby reducing parasitic capacitance between the buried bit lines.

Embodiments may be carried out in other ways than those specifically described herein. Embodiments described herein are to be construed as illustrative and not restrictive. Embodiments should be determined by the appended claims and their legal equivalents, not by the above description, and all changes coming within the meaning and equivalency range of the appended claims are intended to be embraced therein. Also, claims that are not explicitly cited in each other in the appended claims may be presented in combination as an embodiment or included as a new claim by a subsequent amendment after the application is filed.

The above embodiments of the present disclosure are illustrative and not limitative. Variations and modifications are possible. Embodiments are not limited by the type of deposition, etching polishing, and patterning steps described herein. Nor are embodiments limited to any specific type of semiconductor device. For example, embodiments of the present disclosure may be implemented in a volatile memory device or non-volatile memory device. Other additions, subtractions, or modifications are obvious in view of the present disclosure and are intended to fall within the scope of the appended claims.

What is claimed is:

1. A semiconductor device comprising:
 an active region having a line shape that is oblique with respect to a buried bit line;
 a metal silicide pattern disposed in a bit line contact region, the bit line contact region being disposed in a lower portion of the active region; and
 a metal pattern including one or more metal films, wherein each metal pattern adjoins and is electrically coupled to the metal silicide pattern of the active region to form the buried bit line.

2. The semiconductor device according to claim 1, wherein the bit line contact region is disposed in a center portion of a length of the active region.

3. The semiconductor device according to claim 1, wherein the metal silicide pattern and the metal pattern are disposed at substantially the same level over a semiconductor substrate.

4. The semiconductor device according to claim 1, further comprising a concave bulb disposed at a lower portion of a sidewall of the active region.

5. The semiconductor device according to claim 4, wherein a bottom surface of the metal silicide pattern is provided over the substrate at substantially the same level as a bottom portion of the concave bulb.

6. The semiconductor device according to claim 1, wherein the metal silicide pattern includes cobalt silicide, and the metal pattern includes tungsten (W).

* * * * *